United States Patent
Mitsch et al.

(10) Patent No.: US 11,204,838 B2
(45) Date of Patent: Dec. 21, 2021

(54) RUNTIME MODEL VALIDATION FOR PARTIALLY-OBSERVABLE HYBRID SYSTEMS

(71) Applicant: Carnegie Mellon University, Pittsburgh, PA (US)

(72) Inventors: Stefan Mitsch, Pittsburgh, PA (US); Andre Platzer, Pittsburgh, PA (US)

(73) Assignee: CARNEGIE MELLON UNIVERSITY, Pittsburgh, PA (US)

( * ) Notice: Subject to any disclaimer, the term of this patent is extended or adjusted under 35 U.S.C. 154(b) by 230 days.

(21) Appl. No.: 16/685,099

(22) Filed: Nov. 15, 2019

(65) Prior Publication Data

US 2020/0089570 A1    Mar. 19, 2020

Related U.S. Application Data

(63) Continuation-in-part of application No. 15/026,690, filed as application No. PCT/US2014/060019 on Oct. 10, 2014, now Pat. No. 10,872,187.

(60) Provisional application No. 61/999,318, filed on Jul. 23, 2014, provisional application No. 61/961,366, filed on Oct. 11, 2013, provisional application No. 62/917,007, filed on Nov. 15, 2018.

(51) Int. Cl.
    *G06F 11/14*    (2006.01)
    *G06F 30/27*    (2020.01)
    *G06F 11/34*    (2006.01)

(52) U.S. Cl.
    CPC ...... *G06F 11/1415* (2013.01); *G06F 11/3409* (2013.01); *G06F 30/27* (2020.01); *G06F 2201/805* (2013.01)

(58) Field of Classification Search
    CPC .. G06F 11/1415; G06F 30/27; G06F 11/3409; G06F 2201/805; G06F 11/3604; G06F 11/3006; G06F 30/3323; G06F 30/20; G06F 30/15; G05B 23/0286; G05B 19/0428; G05B 23/0245
    See application file for complete search history.

(56) References Cited

U.S. PATENT DOCUMENTS

2011/0295578 A1* 12/2011 Aldrich ............... G06F 8/10
                                                703/6

OTHER PUBLICATIONS

Tan, Li, Jesung Kim, and Insup Lee. "Testing and monitoring model-based generated program." Electronic Notes in Theoretical Computer Science 89.2 (2003): 128-148.*

Zouaghi, Leila, Achim Wagner, and Essam Badreddin. "Monitoring of hybrid systems using behavioural system specification." IFAC Proceedings vols. 44.1 (2011): 8144-8149.*

* cited by examiner

*Primary Examiner* — Saif A Alhija
(74) *Attorney, Agent, or Firm* — Kacvinsky Daisak Bluni PLLC

(57) ABSTRACT

Disclosed herein are techniques to make the synthesized monitoring conditions of partially-observable hybrid systems robust to partial observability of sensor uncertainty and partial controllability due to actuator disturbance. The approach herein shows that the monitoring conditions result in provable safety guarantees with fallback controllers that react to monitor violation at runtime.

31 Claims, 9 Drawing Sheets

(A)

(B)

RUNTIME MODEL VALIDATION FOR PARTIALLY-OBSERVABLE HYBRID SYSTEMS

RELATED APPLICATIONS

This application claims the benefit of U.S. Provisional Patent Application Ser. No. 62/917,007, filed Nov. 15, 2018. In addition, this application is a continuation-in-part of U.S. patent application Ser. No. 15/026,690, filed Apr. 1, 2016, which claims the benefit, under 35 U.S.C. § 371, of PCT Application No. PCT/US14/60019, filed Oct. 10, 2014, which claims the benefit of U.S. Provisional Application No. 61/961,366, filed on Oct. 11, 2013, and U.S. Provisional Application No. 61/999,318, filed Jul. 23, 2014. All of these applications are hereby incorporated in their entireties.

GOVERNMENT INTEREST

This invention was made with government support under contract CNS-1054246 from the National Science Foundation (NSF), contract FA8750-18-C-0092 from the Defense Advanced Research Projects Agency (DARPA)—and contract FA9550-16-1-0228 from the Air Force Office of Scientific Research (AFSOR). The government has certain rights in this invention.

FIELD OF THE INVENTION

This invention pertains to the field of cyber-physical systems (CPS), and, in particular to models approximating the behavior of CPS and methods for monitoring the actual CPS that are based on the models wherein the CPS are partially-observable hybrid systems.

BACKGROUND OF THE INVENTION

Formal verification provides strong safety guarantees about models of cyber-physical systems. Hybrid system models describe the required interplay of computation and physical dynamics, which is crucial to guarantee what computations lead to safe physical behavior (e.g., cars should not collide). Control computations that affect physical dynamics must act in advance to avoid possibly unsafe future circumstances. Formal verification then ensures that the controllers correctly identify and provably avoid unsafe future situations under a certain model of physics. But any model of physics necessarily deviates from reality and, moreover, any observation with real sensors and manipulation with real actuators is subject to uncertainty. This makes runtime validation a crucial step to monitor whether the model assumptions hold for the real system implementation.

Correctness arguments for cyber-physical systems crucially depend on models to enable predictions about their future behavior. Absent any models, neither tests nor verification provide any correctness results except for the limited amount of concrete (test) cases, because they cannot provide predictions for other cases. Models of physics are crucial in CPSs, but necessarily deviate from reality. Even cyber components may come with surprises when their detailed implementation is more complex than their verification model. Linking cyber and physical components with sensors and actuators adds another layer of uncertainty. These discrepancies are inevitable and call into question how safety analysis results about models can ever transfer to CPS implementations. Not using models, however, would invalidate all predictions.

Safety of the CPS implementation at runtime crucially depends on a faithful implementation of the model. However, even though rigorous correct-by-construction approaches promise provably correct implementation of the software portion of the model, their correctness is still predicated on meeting the assumptions of the model about the physical environment and the physical effects of actuators. Whether or not these environment and actuator effects are faithfully represented in the model can only be checked from actual measurements during system operation at runtime. That way, runtime monitoring can help to check the present run of a CPS implementation.

The key question, however, is what property needs to be runtime-monitored and what a runtime monitor says about the safety of the system. There is a fundamental asymmetry of the power of runtime monitoring in CPS compared to purely discrete software systems. In pure software, it may suffice to monitor the critical property itself and suspend the software upon violation, raising an exception to propagate the violation to surrounding code for mitigation. In cyber-physical systems any such attempt would be fundamentally flawed, because there is no way of reverting time and trying something else. For example, a desired property of a self-driving car may be to always keep at least 1 ft distance to other cars. Runtime monitoring this property, however, would raise an alarm when the car is less than 1 ft away, which (when going fast) makes a collision inevitable and all runtime monitoring futile. The underlying problem is that this property expresses unrealistic implicit assumptions about the continuous dynamics of a car.

Formal verification and validation play a crucial role in making cyber-physical systems safe. Formal methods make strong guarantees about the system behavior if accurate models of the system can be obtained, including models of the controller and of the physical dynamics. In CPS, models are essential; but any model that can be built necessarily deviates from the real world. If the real system fits to the model, the behavior of the real system can be guaranteed to satisfy the correctness properties verified with respect to the model. If not, then this verification is impossible.

Cyber-physical systems span controllers and the relevant dynamics of the environment. Since safety is crucial for CPS, their models (e. g., hybrid system models) need to be verified formally. Formal verification guarantees that a model is safe with respect to a safety property. The remaining task is to validate whether the models are adequate, such that the verification results transfer to the system implementation.

Actual system execution, however, provides many opportunities for surprising deviations from the model. Faults may cause the system to function improperly, sensors may deliver uncertain values and actuators may suffer from disturbance. The formal verification may have assumed simpler ideal-world dynamics for tractability reasons or made un-realistically strong assumptions about the behavior of other agents in the environment. Simpler models are often better for real-time decisions and optimizations, because they make predictions feasible to compute at the required rate. The same phenomenon of simplicity for predictability is often exploited for the models in formal verification and validation. As a consequence, the verification results obtained about models of a CPS only apply to the actual CPS at runtime to the extent that the system fits to the model.

Validation (i.e., checking whether a CPS implementation fits to a model) is an interesting but difficult problem. CPS models are more difficult to analyze than ordinary (discrete) programs because of the physical plant, the environment, sensor inaccuracies, and actuator disturbance. In CPS, models are essential; but any model necessarily deviates from the real world. Still, good models can be correct within certain error margins.

SUMMARY OF THE INVENTION

For an unbroken chain of correctness guarantees, runtime monitors are synthesized in a provably correct way from provably safe hybrid system models. This paper advances these techniques to make the synthesized monitoring conditions robust to partial observability of sensor uncertainty and partial controllability due to actuator disturbance. We show that the monitoring conditions result in provable safety guarantees with fallback controllers that react to monitor violation at runtime. We evaluate the method by synthesizing monitoring conditions from existing case studies on train and road traffic control.

Herein we introduce a method (referred to herein as "ModelPlex") to synthesize monitors by theorem proving. The method uses sound proof rules to formally verify that a model is safe and to synthesize provably correct monitors that validate compliance of system executions with the model.

This invention performs runtime model validation. That is, validating whether a model, shown for example, in FIG. 3 as reference number 100, which is assumed for verification purposes is adequate for a particular system execution to ensure that the verification results apply to the current execution. The invention checks system execution with respect to a monitor specification 104, and thus, belongs to the field of runtime verification. Herein, the term runtime validation is used to clearly convey the purpose of monitoring. While "runtime verification" monitors properties without offline verification, "runtime validation" monitors model adequacy to transfer offline verification results. The focus of the invention is on verifiably correct runtime validation to ensure that verified properties of models provably apply, which is important for safety and certification of CPS.

If an observed system execution fits to the verified model 12, then this execution is safe according to the offline verification result about the model. If it does not fit, then the system is potentially unsafe because it no longer has an applicable safety proof, so a verified fail-safe action to avoid safety risks is initiated. Checking whether a system execution fits to a verified model 12 includes checking that the actions chosen by the (unverified) controller implementation fit to one of the choices and requirements of the verified controller model. It also includes checking that the observed states can be explained by the plant model. The crucial questions are: How can a compliance monitor be synthesized that provably represents the verified model? How much safety margin does a system need to ensure that fail-safe actions are initiated early enough for the system to remain safe even if its behavior ceases to comply with the model?

The second question is related to feedback control and can only be answered when assuming constraints on the deviation of the real system dynamics from the plant model. Otherwise, if the real system can be infinitely far off from the model, safety guarantees are impossible. By the sampling theorem in signal processing, such constraints further enable compliance monitoring solely on the basis of sample points instead of the unobservable intermediate states about which no sensor data exists. When such constraints are not available, the method of the present invention still generates verifiably correct runtime tests, which detect deviation from the model at the sampling points, not just between them. A fail-safe action will then lead to best-effort mitigation of safety risks (rather than guaranteed safety).

As presented herein, the present invention is a method to synthesize verifiably correct runtime validation monitors automatically. ModelPlex uses theorem proving with sound proof rules to turn hybrid system models into monitors in a verifiably correct way. Upon non-compliance with the model, ModelPlex initiates provably safe fail-safe actions.

ModelPlex is a principle to build and verify high-assurance controllers for safety-critical computerized systems that interact physically with their environment. It guarantees that verification results about CPS models transfer to the real system by safeguarding against deviations from the verified model. Monitors created by ModelPlex are provably correct and check at runtime whether or not the actual behavior of a CPS complies with the verified model and its assumptions. Upon non-compliance, ModelPlex initiates fail-safe fallback strategies. To initiate the fallback strategies early enough, ModelPlex uses prediction on the basis of disturbed plant models to check safety for the next control cycle. This way, ModelPlex ensures that verification results about a model of a CPS transfer to the actual system behavior at runtime.

For partially-observable systems, the approach disclosed herein provide offline safety proofs which ensure that a controller avoids all safety violations with respect to an explicit model of physics and offline monitor synthesis turns these models into runtime monitors that act in advance with provable safety guarantees about the true CPS/Lastly, the method provides offline proofs to justify that all future model behavior will be safe if the monitor is satisfied at runtime. For example, the specification "keep at least 1 ft distance to other cars" in the disclosed approach considers the dynamics and therefore results in a monitor "always keep sufficient stopping distance" that acts ahead of time as opposed to after a collision is inevitable.

FIG. 5, View (A) illustrates the intuition behind safety proofs and their relation to system execution and monitoring: A system should stay outside unsafe states (collision) so it has to avoid all paths that might eventually end up in unsafe states ((car)collision). A safety proof ([car]¬collision) shows that a model α (car) of the system indeed avoids such paths, no matter how often it is repeated (car*). At runtime, as shown in View(B) of FIG. 5, implementation correctness can be checked with monitors that inspect sensors and influence decisions on each iteration α (every time the controller of the loop α* runs. To guarantee safety, monitors must provably detect when the system is about to enter a path to the unsafe states. Such an approach crucially requires logical foundations for analyzing both [car]¬collision safety and <car>collision liveness in the same framework, which the described chosen differential dynamic logic supports.

The methods disclosed herein advance techniques for these questions from prior work, disclosed in U.S. patent application Ser. No. 15/026,690, incorporated herein in its entirety, with built-in systematic ways of coping with the inevitable complications of sensor uncertainty and actuator disturbance in partially observable hybrid systems.

DETAILED DESCRIPTION

Preliminaries: Differential Dynamic Logic

Figure 1:
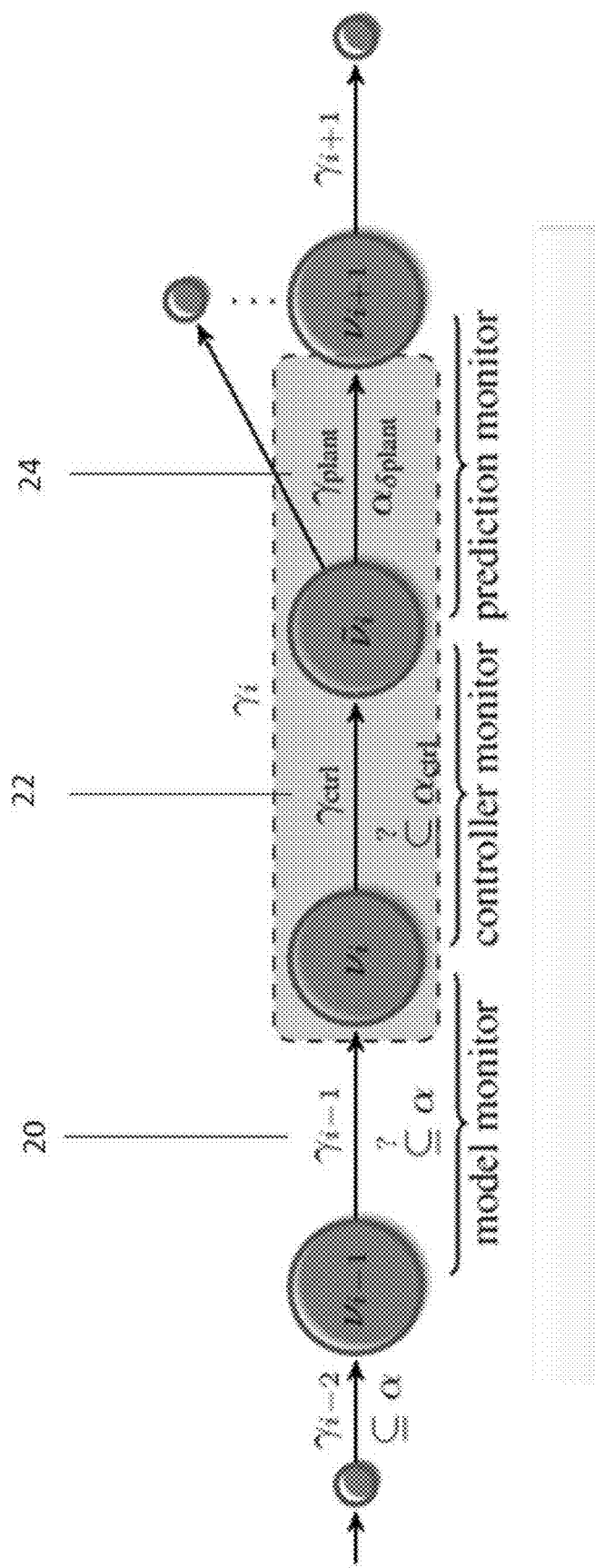
FIG. 1 shows the use of ModelPlex monitors along a system execution.

For hybrid systems verification differential dynamic logic $d\mathcal{L}$ is used, which has a notation for hybrid systems as hybrid programs. $d\mathcal{L}$ allows us to make statements that we want to be true for all runs of a hybrid program ($[\alpha]\emptyset$) or for at least one run ($<\alpha>\emptyset$) of a hybrid program.

Both constructs are necessary to derive safe monitors: $[\alpha]\emptyset$ proofs are needed to ensure that all behavior of a model (including controllers) is safe; $<\alpha>\emptyset$ proofs are needed to find monitor specifications that detect whether or not system execution fits to the verified model.

Table 1 summarizes the relevant syntax fragment of hybrid programs together with an informal semantics. The semantics $\rho(\alpha)$ of hybrid program $\alpha$ is a relation on initial and final states of running $\alpha$. The set of $d\mathcal{L}$ formulas is generated by the following grammar ($<\in\{<, \leq, =, \geq, >\}$ and $\theta_1, \theta_2$ are arithmetic expressions in +, −, ·,/over the reals):

$$\phi ::= \theta_1 \sim \theta_2 | \neg \phi | \phi \wedge \psi | \phi \vee \psi | \phi \rightarrow \psi | \forall x \phi | \exists x \phi | [\alpha]\phi | <\alpha>\phi$$

Differential dynamic logic comes uses a theorem prover with a verification technique to prove correctness properties of hybrid programs. One example of a theorem prover and the one that is used in the preferred embodiment of the invention is KeYmaera.

TABLE 1

Hybrid program representations of hybrid systems.

| Statement | Effect |
|---|---|
| α; β | sequential composition, first run hybrid program α, then hybrid program β |
| α ∪ β | nondeterministic choice, following either hybrid program α or β |
| α* | nondeterministic repetition, repeats hybrid program α n ≥ 0 times |
| x := θ | assign value of term θ to variable x (discrete jump) |
| x := * | assign arbitrary real number to variable x |
| ?F | check that a particular condition F holds, and abort if it does not |
| $(x_1' = \theta_i, \ldots, x_n' = \theta_n \& F')$ | evolve $x_i$ along differential equation system $x_i' = \theta_i$ restricted to maximum evolution domain F' |

ModelPlex Approach for Verified Runtime Validation

CPS are almost impossible to get right without sufficient attention to prior analysis, for instance by formal verification and formal validation techniques. We assume to be given a verified model of a CPS, i.e. formula (1) is proved valid.

Note that differential dynamic logic ($d\mathcal{L}$) and KeYmaera as a theorem prover are used to illustrate the concepts herein. The concept of ModelPlex is not predicated on the use of KeYmaera to prove (1). Other verification techniques could be used to establish validity of this formula. The flexibility of the underlying logic $d\mathcal{L}$, its support for both $[\alpha]\phi$ and $<\alpha>\phi$, and its proof calculus, however, are exploited for systematically constructing monitors from proofs in the sequel.

$$\phi \rightarrow [\alpha^*]\psi \text{ with invariat } \phi \rightarrow [\alpha]\phi \text{ s.t.} \phi \rightarrow \phi \text{ and } \phi \rightarrow \psi \quad (1)$$

Eq.(1) expresses that all runs of the hybrid system $\alpha^*$, which start in states that satisfy the precondition ∅ and repeat the model α arbitrarily many times, must end in states that satisfy the post condition $\psi$. Eq.(1) is proved using some form of induction, which shows that a loop invariant φ holds after every run of α if it was true before. The model α is a hybrid system model 100 of a CPS, which means that it describes both the discrete control actions of the controllers in the system and the continuous physics of the plant and the system's environment.

The safety guarantees obtained by proving Eq.(1) about the model $\alpha^*$ transfer to the real system, if the actual CPS execution fits to $\alpha^*$. Because safety properties should be preserved, a CPS γ fits to a model $\alpha^*$, if the CPS reaches at most those states that are reachable by the model, i.e., $\rho(\gamma) \subseteq \rho(\alpha^*)$. However, we do not know γ and therefore need to find a condition based on $\alpha^*$ that can be checked at runtime to see if concrete runs of γ behave like $\alpha^*$.

Checking the post condition $\psi$ is not sufficient because, if $\psi$ does not hold, the system is already unsafe. Checking the invariant φ is insufficient as well, because if φ does not hold, the controller can no longer guarantee safety, even though the system may not yet be unsafe. But if we detect when a CPS is about to deviate from $\alpha^*$ before leaving φ, we can still switch to a fail-safe controller to avoid $\neg \psi$ from happening.

As shown in FIG. 1, ModelPlex derives three kinds of monitors, a model monitor 20, a controller monitor 22, and a prediction monitor 24. Reachability between consecutive states in α, $\alpha_{ctrl}$, and $\alpha_{\delta plant}$ are checked by verifying states during execution against the corresponding monitor.

Model Monitor 20—

In each state $v_i$ the sample point $v_{i-1}$ from the previous execution $\gamma_{i-1}$ is tested for deviation from the single α, not $\alpha^*$ i. e., test $(v_{i-1}, v_i) \in \rho(\alpha)$. If violated, other verified properties may no longer hold for the system. The system, however, is still safe if a prediction monitor 24 was satisfied on $v_{i-1}$. Frequent violations indicate an inadequate model that should be revised to better reflect reality.

Controller Monitor 22—

In intermediate state $\tilde{v}_i$ the current controller decisions of the implementation $\gamma_{ctrl}$ are tested for compliance with the model, i.e., test $(v_i, \tilde{v}_i) \in \rho(\alpha_{ctrl})$. Controller monitors 22 are designed for switching between controllers similar to Simplex. If violated, the commands from a fail-safe controller replace the current controller's decisions to ensure that no unsafe commands are ever actuated.

Prediction Monitor 24—

In intermediate state $\tilde{v}_i$ the worst-case safety impact of the current controller decisions are tested with respect to the predictions of a bounded deviation plant model $\alpha_{\delta plant}$, which has a tolerance around the model plant $\alpha_{plant}$, i.e., check $v_{i+1} \Box \models \phi$ for all $v_{i+1}$ such that $(\tilde{v}_i, v_{i+1}) \in \rho(\alpha_{\delta plant})$. Note, that all $v_{i+1}$ are simultaneously checked by checking $\tilde{v}_i$ for a characterizing condition of $\alpha_{\delta plant}$. If violated, the current control choice is not guaranteed to keep the system safe until the next control cycle and, thus, a fail-safe controller takes over.

The assumption for the prediction monitor 24 is that the real execution is not arbitrarily far off the plant models used for safety verification, because otherwise guarantees can neither be made on unobservable intermediate states nor on safety of the future system evolution. A separation of disturbance causes in the models can be used: ideal plant models $\alpha_{plant}$ for correctness verification purposes, implementation deviation plant models $\alpha_{\delta plant}$ for monitoring purposes. Any deviation model (e.g., piecewise constant disturbance, differential inclusion models of disturbance) is supported, as long as the deviation is bounded and differential invariants can be found. It is assumed that monitor evaluations are at most some e time units apart (e.g., along with a recurring controller execution). Note that disturbance in $\alpha_{\delta plant}$ is more manageable compared to $\alpha^*$, as single runs $\alpha$ can be focused on instead of repetitions for monitoring.

Relation Between States

A check that inspects states of the actual CPS to detect deviation from the model $\alpha^*$ is systematically derived. First, a notion of state recall is established and shows that, when all previous state pairs comply with the model, compliance of the entire execution can be checked by checking the latest two states $(v_{i-1}, v_i)$.

Definition 1 (State Recall).

V is used to denote the set of variables whose state we want to recall. $\gamma_V^- = \bigwedge_{x \in V} x = x^-$ are used to express a characterization of the values of variables in a state prior to a run of $\alpha$, where the fresh variables $x^-$ to are always presumed to occur solely in $\gamma_V^-$. The variables in $x^-$ can be used to recall this state. Likewise, $\gamma_V^+ = \bigwedge_{x \in V} x = x^+$ is used to characterize the posterior states and expect fresh $x^+$.

With this notation, the following lemma states that an interconnected sequence of $\alpha$ transitions forms a transition of $\alpha^*$.

Lemma 1 (Loop Prior and Posterior State).

Let $\alpha$ be a hybrid program and $\alpha^*$ be the program that repeats arbitrarily many times. Assume that all consecutive pairs of states $(v_{i-1}, v_i) \in \rho(\alpha)$ of $n \in \mathbb{N}^+$ executions, whose valuations are recalled with $\gamma_V^i = \bigwedge_{x \in V} x = x^i$ and $\gamma_V^{i-1}$ are plausible with respect to the model $\alpha$, i.e., $\vDash \bigwedge_{1 \leq i \leq n} (\gamma_V^{i-1} \to \langle \alpha \rangle \gamma_V^i)$ with $\gamma_V^- = \gamma_V^0$ and $\gamma_V^+ = \gamma_V^n$. Then, the sequence of states originates from an $\alpha^*$ execution from $\gamma_V^0$ to $\gamma_V^n$, i.e., $\vDash \gamma_V^- \to \langle \alpha^* \rangle \gamma_V^+$.

Lemma 1 enables us to check compliance with the model $\alpha^*$ up to the current state by checking reachability of a posterior state from a prior state on each execution of $\alpha$ (i.e., online monitoring, which is easier because the loop was eliminated). To find compliance checks systematically, we construct formula (2), which relates a prior state of a CPS to its posterior state through at least one path through the model $\alpha$. Consecutive states for $\alpha^*$ mean before and after executions of $\alpha$ (i.e., $\alpha; \alpha; \alpha$, not within $\alpha$).

$$\gamma_V^- \to \langle \alpha \rangle \gamma_V^+ \qquad (2)$$

Eq.(2) is satisfied in a state v, if there is at least one run of the model $\alpha$ starting in the state v recalled by $\gamma_V^-$ and which results in a state $\omega$ recalled using $\gamma_V^+$. In other words, at least one path through $\alpha$ explains how the prior state v got transformed into the posterior state $\omega$. The d$\mathcal{L}$ Eq.(2) characterizes the state transition relation of the model $\alpha$ directly. Its violation indicates compliance violation. Compliance at all intermediate states cannot be observed by real-world sensors.

In principle, Eq.(2) would be a monitor, because it relates a prior state to a posterior state through the model of a CPS, but the formula is difficult, if not impossible, to evaluate at runtime, because it refers to a hybrid system $\alpha$, which includes non-determinism and differential equations. The basic observation is that any equation that is equivalent to Eq.(2) but conceptually easier to evaluate in a state would be a correct monitor 112. We use theorem proving for simplifying Eq.(2) into quantifier-free first-order real arithmetic form so that it can be evaluated efficiently at runtime. The resulting first-order real arithmetic formula can be easily implemented in a runtime monitor and executed along with the actual controller. A monitor 112 is executable code that only returns true if the transition from the prior system state to the posterior state is compliant with the model 100. Thus, deviations from the model 100 can be detected at runtime, so that appropriate fallback and mitigation strategies can be initiated.

The complexity for evaluating an arithmetic formula over the reals for concrete numbers is linear in the formula size, as opposed to deciding the validity of such formulas, which is doubly exponential. Evaluating the same formula on floating point numbers is inexpensive but may yield wrong results due to rounding errors; on exact rationals, the bit-complexity can be non-negligible. Interval arithmetic is used to obtain reliable results efficiently.

ModelPlex Monitor Synthesis

This section introduces the nature of ModelPlex monitor specifications, the approach in this invention for generating such specifications from hybrid system models, and how to turn those specifications into monitor code that can be executed at runtime along with the controller.

A ModelPlex specification 104 corresponds to the d$\mathcal{L}$ formula (2). If the current state of a system does not satisfy a ModelPlex specification 104, some behavior that is not reflected in the model 100 occurred (e.g., the wrong control action was taken, unanticipated dynamics in the environment occurred, sensor uncertainty led to unexpected values, or the system was applied outside the specified operating environment).

A model monitor $X_m$ checks that two consecutive states v and w can be explained by an execution of the model $\alpha$, i.e., $(v, w) \in \rho(\alpha)$. In the sequel, $BV(\alpha)$ are bound variables in $\alpha$, $FV(\varphi)$ are free variables in $\varphi$, $\Sigma$ is the set of all variables, and $A \backslash B$ denotes the set of variables being in some set A but not in some other set B. Furthermore, we use $v \Box$ to denote v projected onto the variables in A.

Theorem 1 (Model Monitor Correctness).

Let $\alpha^*$ be provably safe, so $\vDash \phi \to [\alpha^*]\psi$. Let $V_m = BV(\alpha) \cup FV(\psi)$. Let $v_0, v_1, v_2, v_3 \ldots \in \mathbb{R}^n$ be a sequence of states, with $v_0 \vDash \phi$ and that agree on $\Sigma \backslash V_m$, i.e., $v_0|_{\Sigma \backslash V_m} = v_k|_{\Sigma \backslash V_m}$ for all k. We define $(v, v_{i+1}) \vDash X_m$ as $X_m$ evaluated in the state resulting from v by interpreting $x^+$ as $v_{i+1}(x)$ for all $x \in V_m$, i.e., $v_{x^+}^{v_{i+1}(x)} \vDash X_m$. If $(v_i, v_{i+1}) \vDash X_m$ for all $i < n$ then we have $v_n \vDash \psi$ where $$X_m \equiv (\phi|_{const} \to \langle \alpha \rangle \gamma_{V_m}^+) \qquad (3)$$

and $\phi|_{const}$ denotes the conditions of $\phi$ that involve only constants that do not change in $\alpha$, i.e., $FV(\phi|_{const}) \cap BV(\alpha) = \emptyset$.

The approach shown herein to generate monitor specifications from hybrid system models 102 takes a verified d$\mathcal{L}$ formula (1) as input 100 and produces a monitor $x_m$ in quantifier-free first-order form as output. The algorithm involves the following steps:

A d$\mathcal{L}$ formula (1) about a model α of the form φ→[α*]ψ is turned into a specification conjecture (3) of the form φ|$_{const}$→⟨α⟩γ$_V^+$. See process 102, resulting in monitor specification 104 in FIG. 3.

Theorem proving on the specification conjecture (3) is applied until no further proof rules are applicable and only first-order real arithmetic formulas remain open. See process 106, resulting in monitor conditions 108, containing only first-order logic (FOL) in FIG. 3. Process 106 is also shown in more detail in FIG. 4, and an algorithmic representation of process 106 is shown herein.

The monitor specification x$_m$ is the conjunction of the unprovable first-order real arithmetic formulas from open sub-goals.

Generate the Monitor Conjecture.

d$\mathcal{L}$ formula (1) is mapped syntactically to a specification conjecture of the form (3). By design, this conjecture will not be provable. But the unprovable branches of a proof attempt will reveal information that, had it been in the premises, would make (3) provable. Through γ$_{V_m}^+$, those unprovable conditions collect the relations of the posterior state of model α characterized by x$^+$ to the prior state x, i.e., the conditions are a representation of (2) in quantifier-free first-order real arithmetic.

Use Theorem Proving to Analyze the Specification Conjecture.

The proof rules of d$\mathcal{L}$ are used to analyze the specification conjecture x$_m$. These proof rules syntactically decompose a hybrid model 100 into easier-to-handle parts, which leads to sequents with first-order real arithmetic formulas towards the leaves of a proof. Using real arithmetic quantifier elimination we close sequents with logical tautologies, which do not need to be checked at runtime since they always evaluate to true for any input. The conjunction of the remaining open sequents is the monitor specification 104, which implies (2).

A complete sequence of proof rules applied to the monitor conjecture of the water tank is described in below. Most steps are simple when analyzing specification conjectures: sequential composition (⟨;⟩), nondeterministic choice (⟨∪⟩), deterministic assignment (⟨:=⟩) and logical connectives (∧r etc.) replace current facts with simpler ones or branch the proof. Challenges arise from handling nondeterministic assignment and differential equations in hybrid programs.

First, consider nondeterministic assignment x:=*. The proof rule for nondeterministic assignment (⟨*⟩) results in a new existentially quantified variable. By sequent proof rule ∃r, this existentially quantified variable is instantiated with an arbitrary term θ, which is often a new logical variable that is implicitly existentially quantified. Weakening (Wr) removes facts that are no longer necessary.

$$(\langle*\rangle) \frac{\exists X(x:=X)\phi_1}{\langle x:=*\rangle\phi} \quad (\exists r) \frac{\Gamma \vdash \phi(\theta), \exists x\, \phi(x), \Delta_2}{\Gamma \vdash \exists x\, \phi(x), \Delta} \quad (Wr) \frac{\Gamma \vdash \Delta}{\Gamma \vdash \phi, \Delta}$$

Optimization 1 (Instantiation Trigger).

If the variable is not changed in the remaining α, x$_i$=x$_i^+$ is γ$_{V_m}^+$ and X is not bound in γ$_{V_m}^+$, then instantiate the existential quantifier by rule ∃r with the corresponding x$_i^+$ that is part of the specification conjecture (i.e., θ=x$_i^+$), since subsequent proof steps are going to reveal θ=x$_i^+$ anyway.

Otherwise, a new logical variable is introduced which may result in an existential quantifier in the monitor specification if no further constraints can be found later in the proof.

Next, differential equations are handled. Even when the differential equation can be solved, existentially and universally quantified variables remain. Inspect the corresponding proof rule from the d$\mathcal{L}$ calculus. For differential equations it must be proven that there exists a duration t, such that the differential equation stays within the evolution domain H throughout all intermediate times t̄ and the result satisfies φ at the end. At this point there are three options:

i. Option 1: instantiate the existential quantifier, if it is known that the duration will be t$^+$;
   ii. Option 2: introduce a new logical variable, which is the generic case that always yields correct results, but may discover monitor specifications that are harder to evaluate;
   iii. Option 3: use quantifier elimination (QE) to obtain an equivalent quantifier-free result (a possible optimization could inspect the size of the resulting formula).

The analysis of the specification conjecture finishes with collecting the open sequents from the proof to create the monitor specification x$_m \overset{def}{\equiv}$ ⋀ (open sequent) 104. The collected open sequents may include new logical variables and new (Skolem) function symbols that were introduced for nondeterministic assignments and differential equations when handling existential or universal quantifiers. The invertible quantifier rule i∃ is used to re-introduce existential quantifiers for the new logical variables. Often, the now quantified logical variables are discovered to be equal to one of the post-state variables later in the proof, because those variables did not change in the model after the assignment. If this is the case, proof rule ∃σ can be used to further simplify the monitor specification by substituting the corresponding logical variable x with its equal term θ.

$$(i\exists) \frac{\Gamma \vdash \exists X(\wedge_i(\Phi_i \vdash \Psi_i)), \Delta_1}{\Gamma, \Phi_1 \vdash \Psi_1, \Delta \ldots \Gamma, \Phi_n \vdash \Psi_n, \Delta} \quad (\exists \sigma) \frac{\phi(\theta)_2}{\exists x(x = \theta \wedge \phi(x))}$$

[1] Among all open branches, free logical variable X only occurs in the branches Γ, Φ$_i$ ⊢ Ψ$_i$, Δ

[2] Logical variable x does not appear in term θ

Controller Monitor Synthesis

Figure 3:
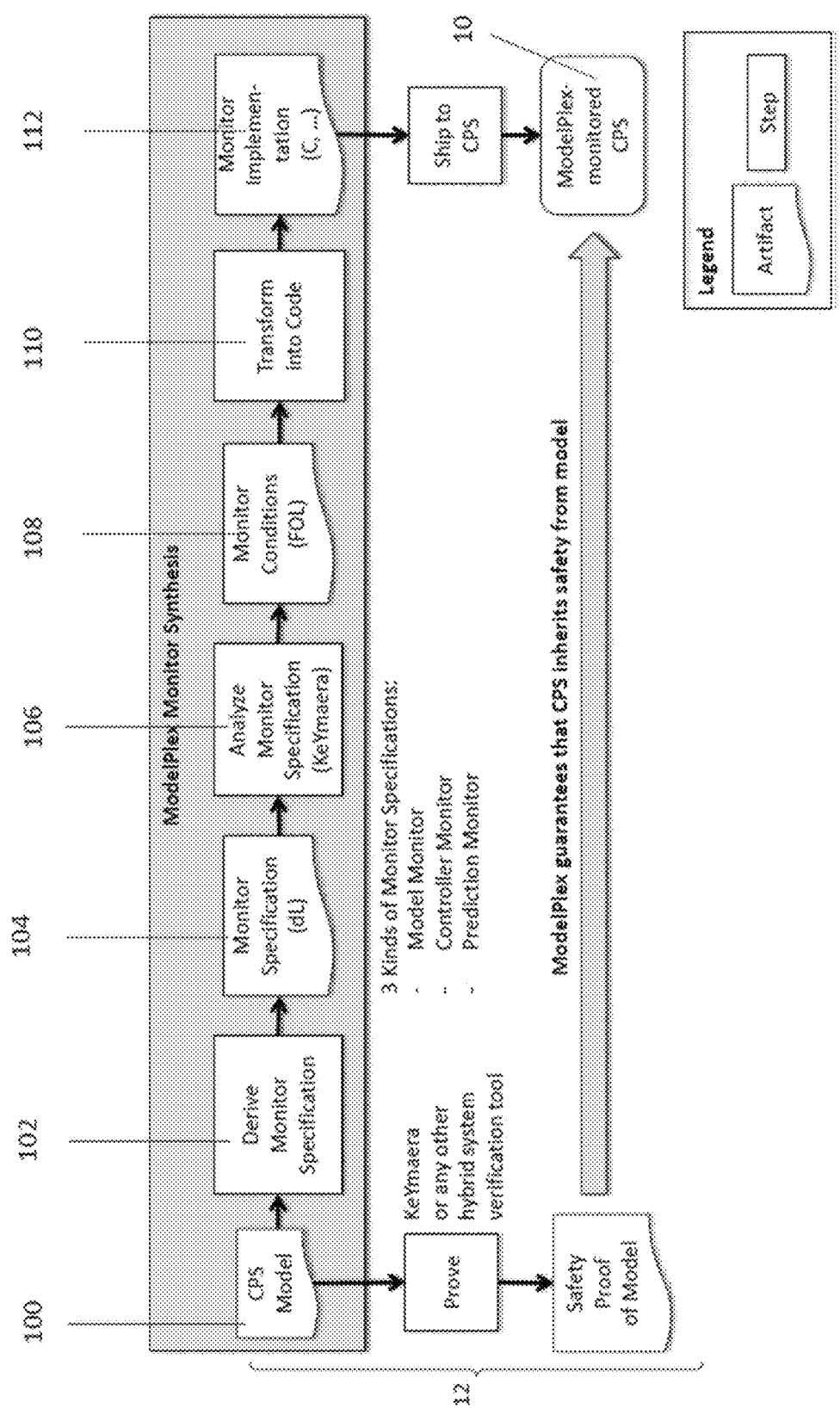
FIG. 3 is a high level flow chart of the process of deriving monitors from a model.

A controller monitor x$_c$, shown as reference number 112 in FIG. 3, checks that two consecutive states v and ω are reachable with one controller execution α$_{ctrl}$, i. e., (v,ω)∈ρ(α$_{ctrl}$) with V$_c$=BV(α$_{ctr}$)∪FV(ψ). Controller monitors 112 are systematically derived in processes 106 and 110 from formulas 104: φ|$_{const}$→⟨α$_{ctrl}$⟩γ$_{V_c}^+$. A controller monitor 112 can be used to initiate controller switching similar to Simplex.

Theorem 2 (Controller Monitor Correctness).

Let α of the canonical form α$_{ctrl}$; α$_{plant}$. Assume ⊨ φ→[α*]φ has been proven with invariant φ as in (1). Let v⊨ φ|$_{const}$∧φ, as checked by x$_m$(Theorem 1). Furthermore, let ṽ be a post-controller state. If (v, ṽ)⊨x$_c$ with x$_c$≡φ|$_{const}$→⟨α$_{ctrl}$⟩γ$_{V_c}^+$ then we have that (v, ṽ)∈ρ(α$_{ctrl}$) and ṽ⊨ φ.

Monitoring in the Presence of Expected Uncertainty and Disturbance

Up to now exact ideal-world models have been considered. However, real-world clocks drift, sensors measure with some uncertainty, and actuators are subject to disturbance. This makes the exact models safe but too conservative, which means that monitors for exact models are likely to fall back to a fail-safe controller unnecessarily often. This section is a discussion of how ModelPlex specifications are found such that the safety property (1) and the monitor specification become more robust to expected uncertainty and disturbance. That way, only unexpected deviations beyond those captured in the normal operational uncertainty and disturbance of α* cause the monitor to initiate fail-safe actions.

In d$\mathcal{L}$ we can, for example, use nondeterministic assignment from an interval to model sensor uncertainty and piecewise constant actuator disturbance, or differential inequalities for actuator disturbance. Such models include non-determinism about sensed values in the controller model and often need more complex physics models than differential equations with polynomial solutions.

Currently, for finding model monitors, our prototype tool solves differential equations by the proof rule ('). Thus, it finds model monitor specifications for differential algebraic equations with polynomial solutions and for differential algebraic inequalities, which can be refined into solvable differential algebraic equations. For prediction monitors (discussed below) d$\mathscr{L}$ techniques are used for finding differential variants and invariants, differential cuts, and differential auxiliaries to handle differential equations and inequalities without polynomial solutions.

Monitoring Compliance Guarantees for Unobservable Intermediate States

With controller monitors, non-compliance of a controller implementation with respect to the modeled controller can be detected right away. With model monitors, non-compliance of the actual system dynamics with respect to the modeled dynamics can be detected when they first occur. In such cases, a fail-safe action is switched to, which is verified using standard techniques, in both non-compliance cases. The crucial question is: can such a method always guarantee safety? The answer is linked to the image computation problem in model checking (i. e., approximation of states reachable from a current state), which is known to be not semi-decidable by numerical evaluation at points; approximation with uniform error is only possible if a bound is known for the continuous derivatives. This implies that additional assumptions are needed about the deviation between the actual and the modeled continuous dynamics to guarantee compliance for unobservable intermediate states. Unbounded deviation from the model between sample points just is unsafe, no matter how hard a controller tries. Hence, worst-case bounds capture how well reality is reflected in the model.

A prediction monitor is derived to check whether a current control decision will be able to keep the system safe for time ε even if the actual continuous dynamics deviate from the model. A prediction monitor checks the current state, because all previous states are ensured by a model monitor and subsequent states are then safe by (1).

Definition 2 (ε-Bounded Plant with Disturbance δ).

Let $\alpha_{plant}$ be a model of the form x':=θ & H. An ε-bounded plant with disturbance δ, written $\alpha_{\delta plant}$, is a plant model of the form $x_o:=0; (f(\theta, \delta) \le x' \le g(\theta, \delta) \& H \wedge x_o \le \varepsilon)$ for some f, g with fresh variable ε>0 and assuming $x_o'=1$. That disturbance δ is constant if x∉δ; it is additive if f(θ, δ)=θ−δ and g(θ, δ)=θ+δ.

Theorem 3 (Prediction Monitor Correctness).

Let α* be provably safe, i. e., ⊨φ→[α*]ψ has been proved using invariant φ as in (1). Let $V_p$=BV (α)∪FV ([α]φ]). Let v ⊨ φ$|_{const}$∧φ, as checked by $\chi_m$ from Theorem 1. Further assume $\tilde{v}$ such that (v, $\tilde{v}$)∈ρ($\alpha_{ctrl}$), as checked by x from Theorem 2. If (v, $\tilde{v}$) ⊨ $\chi_p$ with $\chi_p$=(φ$|_{const}$∧φ)→ $\langle \alpha_{ctrl} \rangle (\gamma_{V_p}^+ \wedge [\alpha_{plant}]\varphi)$, then we have for all ($\tilde{v}$,ω) ρ($\alpha_{\delta plant}$) that ω ⊨ φ.

By adding a controller execution $\langle \alpha_{ctrl} \rangle$ prior to the disturbed plant model, we synthesize prediction monitors that take the actual controller decisions into account. For safety purposes, a monitor definition without controller $\chi_p$=(φ□$_{const}$∧φ)→[$\alpha_{\delta plant}$]φ could be used, but doing so results in a conservative monitor, which has to keep the CPS safe without knowledge of the actual controller decision.

Decidability and Computability

One useful characteristic of ModelPlex beyond soundness is that monitor synthesis is computable, which yields a synthesis algorithm, and that the correctness of those synthesized monitors with respect to their specification is decidable. See Theorem 4.

Theorem 4 (Monitor Correctness is Decidable and Monitor Synthesis Computable).

Assume canonical models of the form α≡$\alpha_{ctrl}$; $\alpha_{plant}$ without nested loops, with solvable differential equations in $\alpha_{plant}$ and disturbed plants $\alpha_{\delta plant}$ with constant additive disturbance δ (see Definition. 2). Then, monitor correctness is decidable, i. e., the formulas $\chi_m \rightarrow \langle \alpha \rangle \gamma_V^+$, $\chi_c \rightarrow \langle \alpha_{ctrl} \rangle \gamma_V^+ \gamma_V^+$, and $\chi_p \rightarrow \langle \alpha_{ctrl} \rangle (\gamma_V^+ \wedge [\alpha_{\delta plant}]\varphi)$ are decidable. Also, monitor synthesis is computable, i. e., the functions synth$_m$: $\langle \alpha \rangle \gamma_V^+ \mapsto \chi_m$, synth$_c$: $\langle \alpha_{ctrl} \rangle \gamma_V^+ \mapsto \chi_c$, and synth$_p$: $\langle \alpha_{ctrl} \rangle (\gamma_V^+ \wedge [\alpha_{\delta plant}]\varphi) \mapsto \chi_p$ are computable.

Monitor Synthesis and Fallback Controller Design—Design-by-Contract Monitoring

Preconditions, postconditions and invariants are crucial conditions in CPS design. Monitors for these conditions can check (i) whether or not it is safe to start a particular controller (i. e., check that the precondition of a controller is satisfied), (ii) whether or not a controller complies with its specification (i. e., check that a controller delivers set values that satisfy its post condition), and (iii) whether or not the system is still within its safety bounds (i. e., check that the loop invariant of α* is satisfied).

Precondition and post condition monitors are useful to decide whether or not it is safe to invoke a controller in the current state, and whether or not to trust a controller output. An invariant monitor of a CPS α* captures the main assumptions that have to be true throughout system execution. When an invariant monitor is unsatisfied, it may no longer be safe to run the CPS; a fail-safe controller can act as a mitigation strategy.

Design-by-contract monitors are useful to monitor specific design decisions, which are explicitly marked in the model. Our approach systematically creates monitors for a complete specification of the behavior of the model.

Monitor Synthesis

Once we found a model monitor, controller monitor, or prediction monitor specification, we want to turn it into an actual monitor implementation (e. g., in C). The main challenge is to reliably transfer the monitor specification, which is evaluated on $\mathbb{R}$, into executable code that uses floating point representations. We use the interval arithmetic library Apron to represent each real arithmetic value with an interval of a pair of floating point numbers. The interval reliably contains the real.

For certification purposes one still has to argue for the correctness of the actual machine code of the synthesized monitor. This entails that the transformation from the monitor specification as a first-order formula into actual code that evaluates the formula must be formally verified. If the synthesized code is still a high-level language, a certified compiler, can be used to produce machine code. Such a comprehensive proof chain suitable for certification is part of our ongoing research.

Designing for a Fail-Safe Fallback Controller

When we design a system for a fail-safe fallback controller $ctrl_{safe}$, it is important to know within which bounds the fail-safe controller can still keep our CPS safe, and which design limits we want a controller implementation to obey. The invariant of a CPS with the fail-safe fallback controller describes the safety bounds. When we start the fail-safe fallback controller $ctrl_{safe}$ in a state where its invariant G is satisfied, it will guarantee to keep the CPS in a state that satisfies the safety property $\psi$.

So, to safely operate an experimental controller $ctrl_{exp}$, we want a monitor that informs us when the experimental controller can no longer guarantee the invariant of the fail-safe controller or when it is about to violate the design limits.

A design for a CPS with a fail-safe fallback controller, therefore, involves proving two properties. First, we prove that the fail-safe controller $ctrl_{safe}$ ensures the safety property $\psi$ as in Eq.(4) below. This property is only provable if we discover an invariant G for the CPS with the fail-safe controller. Then we use G as the safety condition for generating a prediction monitor.

$$\emptyset \mapsto [(ctrl_{safe};plant)*@inv(G)]\psi \quad (4)$$

With this generic structure in mind, we can design for a fallback controller invoked by a model monitor $X_m$, controller monitor $X_c$, or prediction monitor $X_p$. Upon violation of either $X_m$, $X_c$, or $X_p$ by the actual system execution, the set values of a fail-safe controller are used instead.

Monitor Synthesis Algorithm

Figure 4:
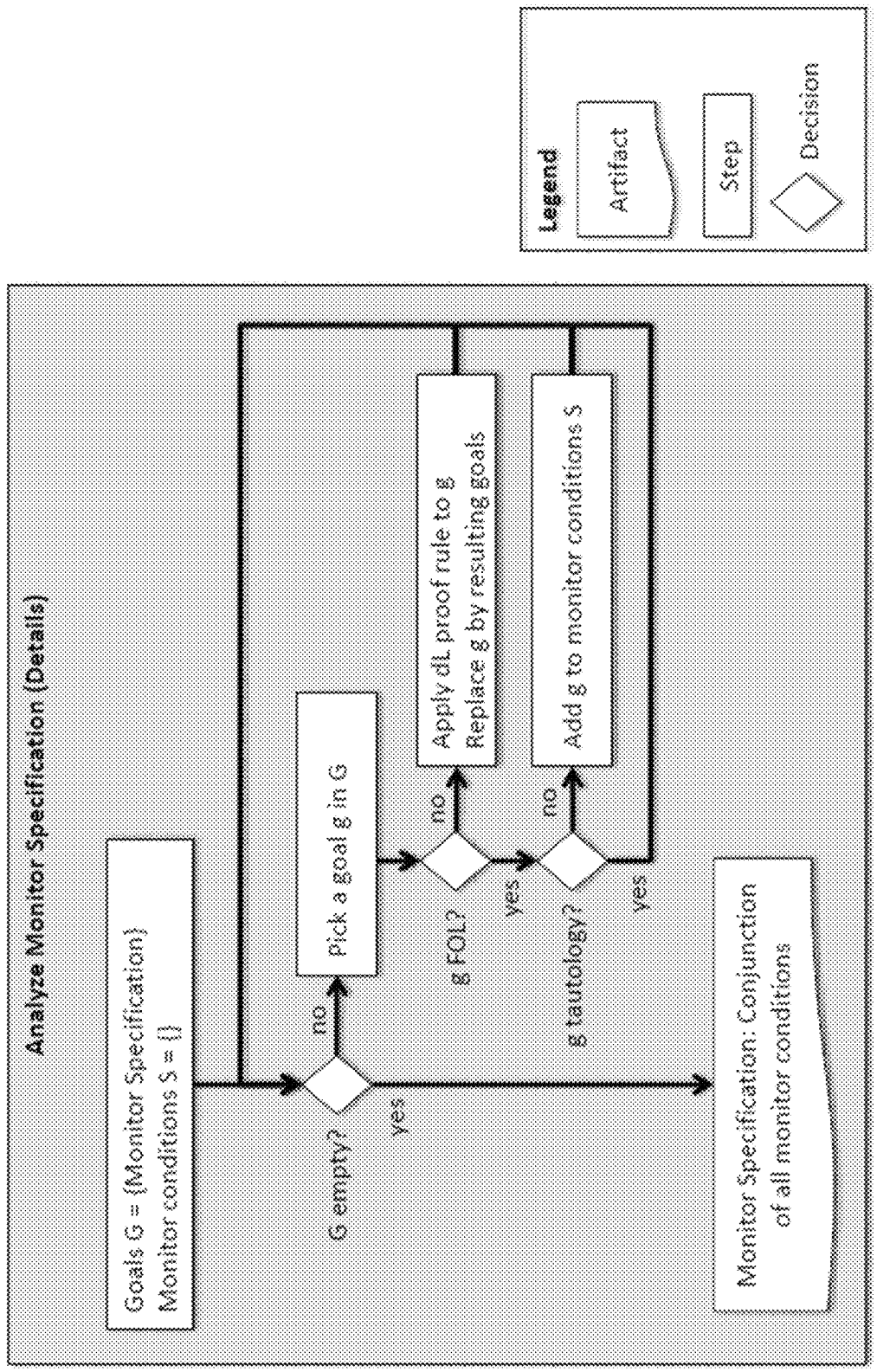
FIG. 4 is a flow chart of the "Analyze Monitor Specification" step of the process shown in FIG. 3.
Figure 5:
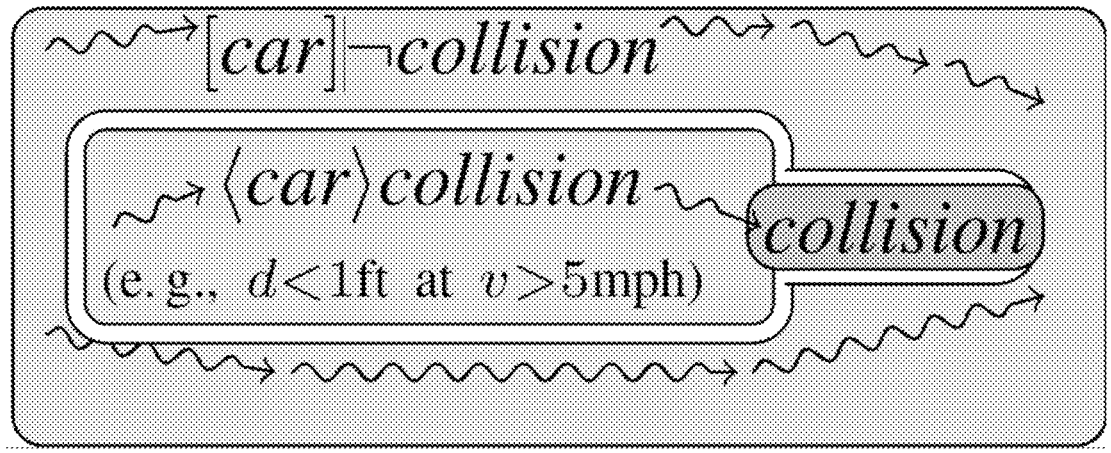
FIG. 5 illustrates the intuition behind safety proofs and their relation to system execution and monitoring.
Figure 5:
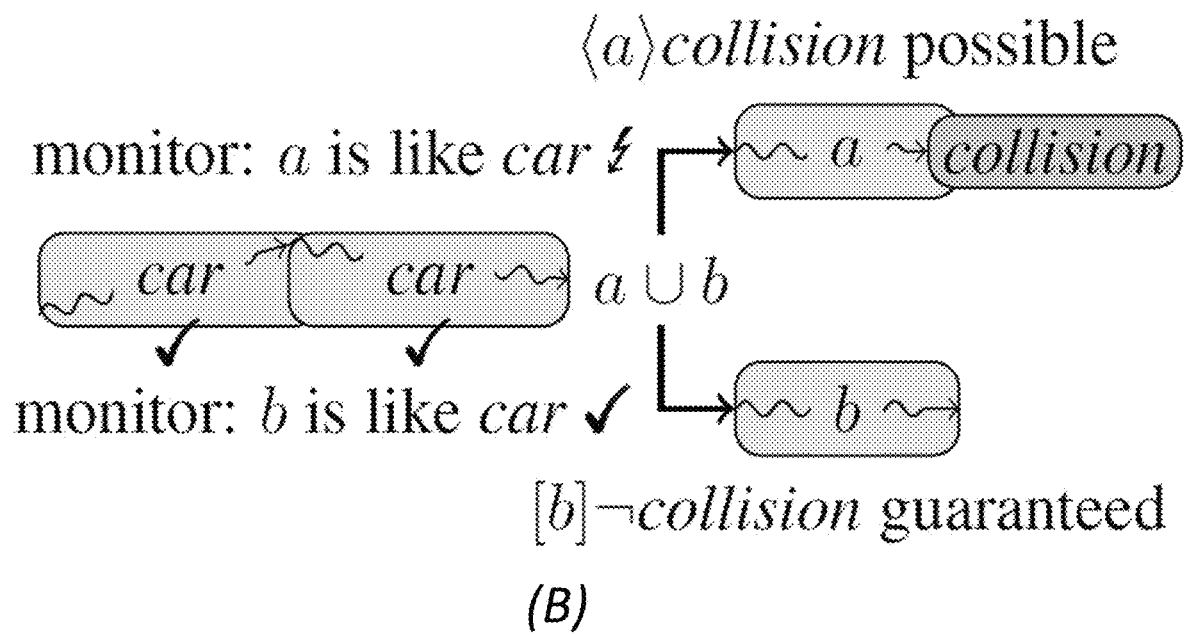

Algorithm 1 lists the ModelPlex specification conjecture analysis algorithm 106, which turns a specification conjecture into an actual monitor, and is shown in flow-chart form in FIG. 4. The algorithm takes a hybrid system model α, a set of variables V that we want to monitor, and an initial condition Ø including constraints on the variables not changed in a. (Usually, we want a monitor for all the bound variables of the hybrid system model, i. e., V=BV (α).

Simulation

To illustrate the behavior of the water tank model with a fallback controller, we created two monitors: Monitor $X_m$ validates the complete model (as in the examples throughout this work) and is executed at the beginning of each control cycle (before the controller runs). Monitor $X_c$ validates only the controller of the model α (compares prior and post state of $$f := *; ?-1 \le f \le \frac{m-x}{\varepsilon})$$

and is executed after the controller but before control actions are issued. Thus, monitor X, resembles conventional runtime verification approaches, which do not check CPS behavior for compliance with the complete hybrid model. This way, unexpected deviations from the model are detected at the beginning of each control cycle, while unsafe control actions are detected immediately before they are taken. With only monitor $X_m$ in place an additional control cycle would be required to detect unsafe control action, whereas with only monitor $X_c$ in place, deviations from the model would be missed. Note that the monitor $X_m$ could be run in place of $X_c$ to achieve the same effect. But monitor $X_m$ implements a more complicated formula, which is unnecessary when only the controller output should be validated.

Figure 2:
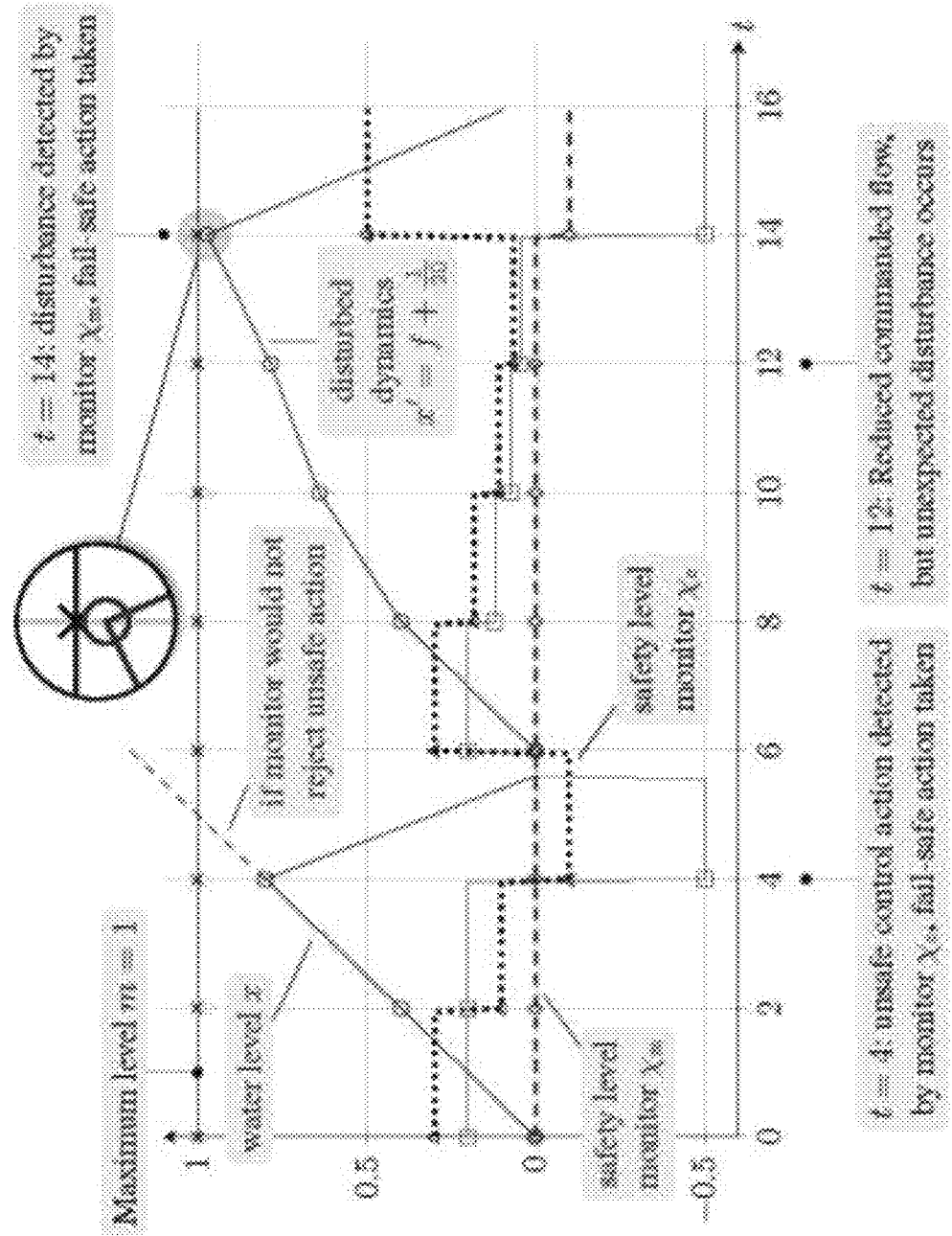
FIG. 2 show the water tank simulation using monitors

FIG. 2 shows a plot of the variable traces of one simulation run. In the simulation the pump controller was run every 2 s ($\varepsilon$=2 s), indicated by the grid for the abscissa and

---

Algorithm 1: ModelPlex monitor synthesis

--- input : A hybrid program α, a set of variables v ⊆ BV(α), an initial condition φ such
that |= φ -> [α*]ψ,
output: A monitor $\chi_m$ such that |= $\chi_m$ ≡ φ|$_{const}$ → <α>Y⁺,
begin
   | S ← ∅
   | Y⁺ ← Λ$_{x \in v}$ x = x⁺ with fresh variables $x_i^+$     // Monitor conjecture
   | G ← {⊢ φ|$_{const}$ → <α>Y⁺}
   | while G ≠ ∅ do     // Analyze monitor conjecture
   |    | foreach g ∈ G do
   |    |    | G ← G - {g}
   |    |    | if g is first-order then
   |    |    |    | if |≠ g then S ← S ∪ {g}
   |    |    | else
   |    |    |    | g̃ ← apply dL proof rule to g
   |    |    |    | G ← G ∪ {g̃}
   |    |    | —
   |    | —
   | —
— $\chi_m$ ← Λ$_{s \in S}$ s     // Collect open sequents the marks on sensor and actuator plots). The controller was set to pump with $$\frac{5(m-x_0)}{2\varepsilon} = \frac{5}{2}$$

for the first three controller cycles, which is unsafe on the third controller cycle. Monitor B immediately detects this violation at t=4, because on the third controller cycle setting f=5/2 violates $$f \leq \frac{m-x_1}{\varepsilon}.$$

The fail-safe action at t=4 drains the tank and, after that, normal operation continues until t=12. Unexpected disturbance $$x' = f + \frac{1}{20}$$

occurs throughout t=[12, 14], which is detected by monitor $X_m$. Note, that such a deviation would remain undetected with conventional approaches (monitor $X_c$ is completely unaware of the deviation). In this simulation run, the disturbance is small enough to let the fail-safe action at t=14 keep the water tank in a safe state.

Partially-Observable Systems
Monitor Synthesis for Verified Runtime Validation

CPS are almost impossible to get right without sufficient attention to prior analysis, for instance by formal verification. Performed offline, these approaches result in a verified model of a CPS, i.e. Eq.(5) is proved valid, for example using the differential dynamic logic proof calculus implemented in KeYmaera X:

$$A \rightarrow [\alpha^*]S \qquad (5)$$

Eq. (5) expresses that all runs of the hybrid system $\alpha^*$, which starts in states that satisfy the precondition A and repeat a arbitrarily many times, only end in states that satisfy the postcondition S. The model $\alpha^*$ is a hybrid system model of a CPS, which means that it describes both the discrete control actions of the controllers in the system and the continuous physics of the plant and the system's environment.

Figure 6:
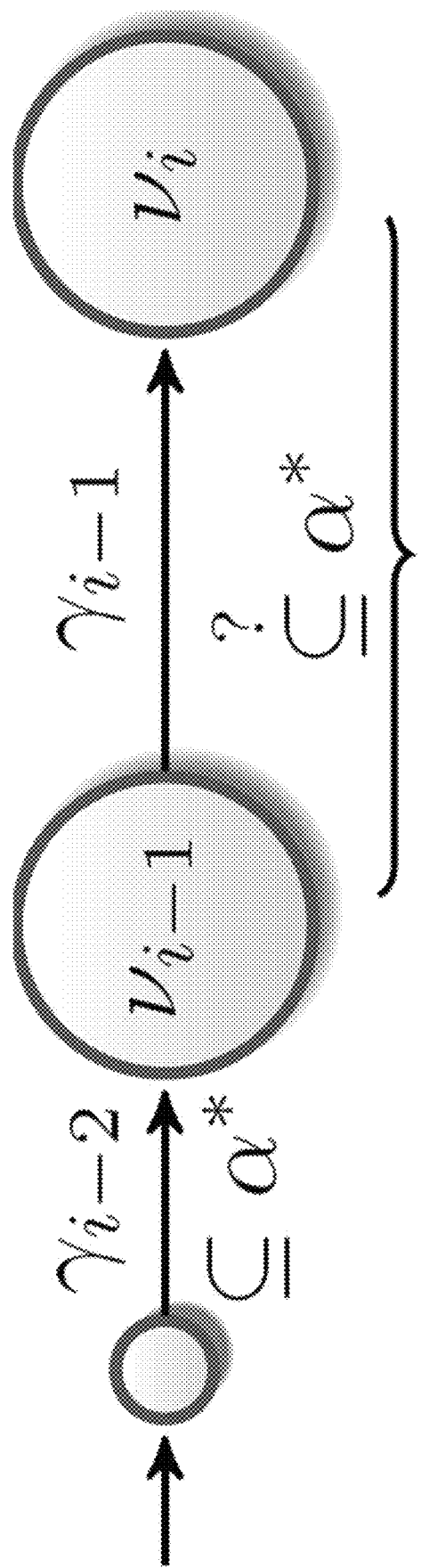
FIG. 6 shows a model monitor in which a system execution is checked for validation against a model.

Whether or not the control choices, actuator and environment effects are faithfully represented in the model can only be checked from actual measurements. Intuitively, such checks compare the values x in state $v_{i-1}$ to the values $x^+$ in state $v_i$ taken at successive sample times to determine compatibility of the unknown system behavior $\gamma_{i-1}$ with model $\alpha^*$ as shown in FIG. 6.

For example, values x=2 and $x^+$=3 are compliant with the differential equation x'=2, because starting the program at x can produce $x^+$, as witnessed by a proof of the $d\mathcal{L}$ formula $x=2 \land x^+=3 \rightarrow \langle x'=2 \rangle x^+=x$. No $x^+ < x$ is compliant with the program, because the program can reach only states where $x^+ \geq x$.

ModelPlex, as described in U.S. patent application Ser. No. 15/026,690, provides the basis for obtaining such runtime checks from hybrid system models both automatically and in a provably correct manner. ModelPlex analyzes hybrid programs $\alpha$, starting from monitor conditions in d $\mathcal{L}$ of the form $\langle \alpha \rangle \gamma^+$, where $\gamma^+$ is a shortcut notation for $x^+=x$ for all $x \in BV(\alpha)$ to collect the effect of executing $\alpha$. The satisfaction relation $(w, v) \models \phi$ can be used to refer to a monitor condition that is satisfied over two states w and v.

Definition 3 (Transition Satisfaction Relation).

The satisfaction relation $(w, v) \models \phi$ of $d\mathcal{L}$ formula $\phi$ for a pair of states $(w, v)$ evaluates $\phi$ in the state resulting from state w by interpreting variable $x^+$ as $v(x)$ for all $x \in V$, i.e., $(w, v) \models \phi$ iff $w_{x^+}^{v(x)} \in [[\phi]]$.

The central correctness result about ModelPlex, as shown by Theorem 1, guarantees that the resulting monitoring formula preserves safety (i.e., if the monitoring formula evaluates to true with current sensor measurements and control choices, then the system is safe).

In the following sections, the ModelPlex monitor synthesis techniques are advanced to account for actuator disturbance and sensor uncertainty in partially observable cases.

Robustness to Actuator Disturbance

Actuator disturbance results in discrepancies between the chosen control decisions u and their physical effect ũ (e.g., wheel slip). A typical pattern to model piecewise constant actuator disturbance chooses a nondeterministic value i in the Δ-neighborhood around the control choice u (but does not affect other state variables) as input to the plant: u:∈ctrl (x); ũ∈$U_\Delta$(u); x'=f(x,ũ).

Actuator disturbance is partially observable by monitoring the difference between the intended effect x'=f(x, u) and the actual effect x'=f(x,ũ) from observable quantities. As a side effect, safety and invariant properties of models do not mention the perturbed actuator effect. For example, a car controller can estimate deviation from its acceleration choice only after the fact by observing the actual resulting speed difference. The safety property of interest is usually about the actual resulting speed and not the perturbed acceleration. For monitor synthesis, we therefore adapt the input-output relation $\gamma^+$ to conjecture existence of an effective actuator effect $\tilde{u}^+$ that explains all other effects collected in $\gamma^+$ about a program $\alpha$. The monitor condition, shown in Eq. (6), can be turned into arithmetical form with the prior synthesis process and preserves safety by Theorem 5.

$$\langle \alpha \rangle \exists \tilde{u}^+ \gamma^+ \qquad (6)$$

Theorem 5 (Monitor with Actuator Disturbance Preserves Invariants).

Let $\alpha$ be a hybrid program of the shape u:∈ctrl(x); ũ∈$U_\Delta$(u); x'=f(x,ũ). Let $\alpha^*$ preserve an invariant J where ũ∉FV(J), so J→[$\alpha$]J is valid. Assume the system transitions from state w to v, which agree on BV($\alpha$)$^C$, and assume w∈[[J]]. If the monitor condition in Eq. (6) is satisfied (i.e., $(w, v) \models \langle \alpha \rangle \exists \tilde{u}^+ \gamma^+$), then the invariant is preserved (i.e., v∈[[J]]).

Theorem 5 extends to multiple control outputs u and their effects with disturbance ũ in a straightforward way. The controller u:∈ctrl(x) does not access u and ũ∉FV(J) is therefore natural as no information about l needs to be maintained in the invariant J.

Partial Observability from Sensor Uncertainty

Monitor correctness requires that all bound variables of a program $\alpha$ are monitored (i.e., BV($\alpha$)⊆FV($\gamma^+$)). This is the appropriate behavior except for variables that are unobservable in the CPS implementation. For example, when controllers use sensors to obtain information, only the measurement is known, but not the true value that the sensor is measuring. If a variable is unobservable then it cannot be included in a runtime monitor. But there may still be indirect implications about unobservable quantities when they are related to observable quantities, which necessitates monitors that indirectly check the properties of the true quantity from the measured quantity.

Figure 7:
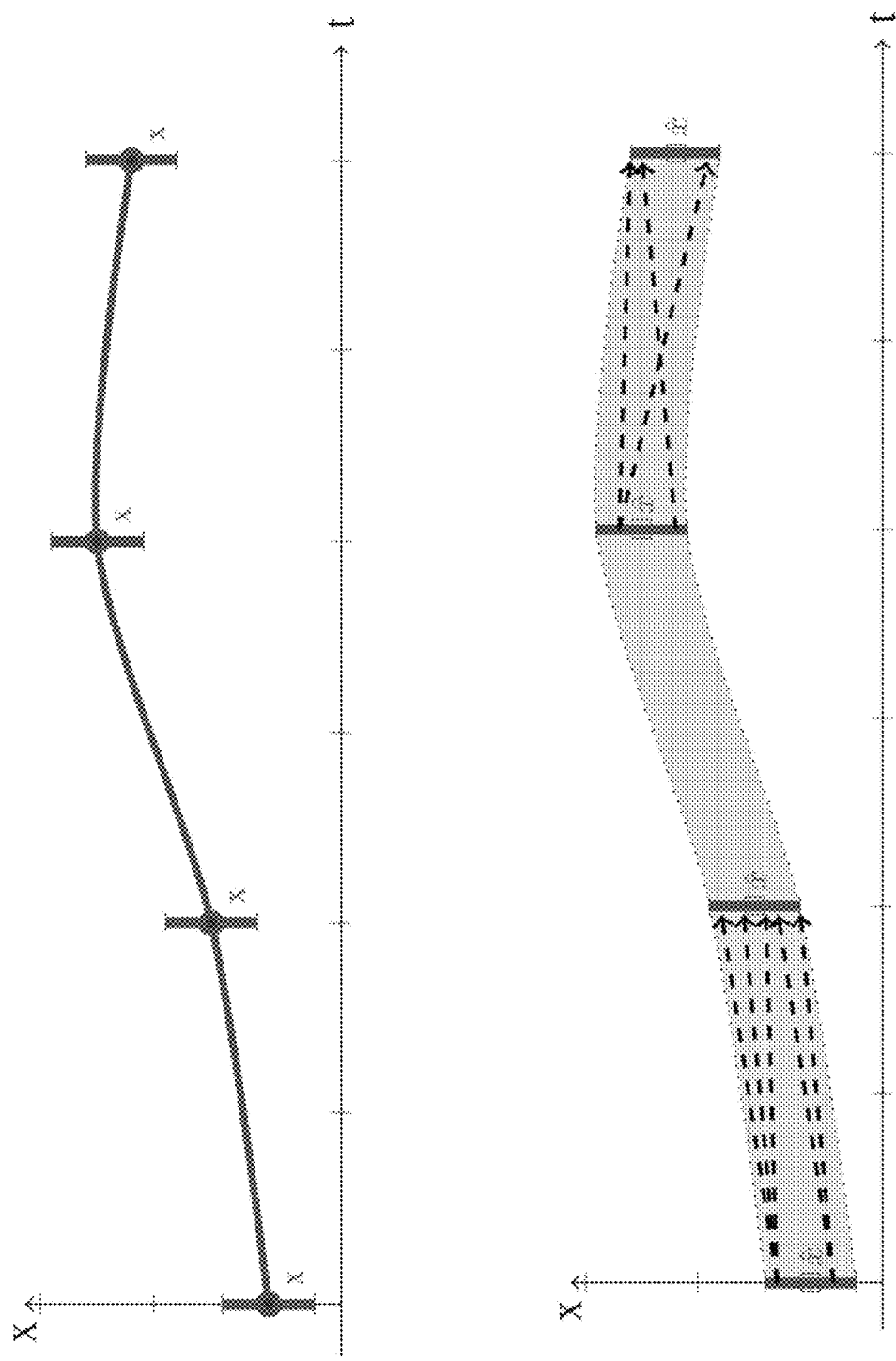
FIG. 7, View (A) is a graph showing that controller observe true behavior through sensors. View (B) is a graph showing that monitors must check for the existence of a behavior that fits the model and explains the observed measurements.

Unobservability results in a crucial difference between monitoring and control (and its safety proofs). Controllers estimate true behavior by taking measurements and observing the effect of their decisions in the next measurements that are again taken from the true values. Monitors must decide whether the measurements explain a true behavior that fits to the expected behavior model. FIG. 7, View (A) is a graph showing measurements $\hat{x}$ taken near the true value x for a particular sensor. The bars indicate the uncertainty in the measurements. FIG. 7, View (B) shows estimating true values of x from sample measurements $\hat{x}$, considering $\hat{x}$ plausible if the model behavior fits to any possible true x.

The measurements of a controller are taken from points that are linked through the underlying true behavior by assumption. Monitors cannot make this assumption, which results in a number of challenges that are discussed in this section: (i) check existence of behavior as explanation from a set of potential true values into a set of potential next true values; (ii) link explanations to a full path through sets of potential true values around a history of observations; and (iii) guarantee safety in both cases.

y with y∈x is used to refer to an unobservable state variable and $\hat{y}$ is used to denote a measurement of y with some uncertainty $\Delta$, so $\hat{y} \in U_\Delta(y)$. Assume non-faulty sensors that function according to their characteristics (i.e., they reliably deliver values that only deviate from the true values by at most some known sensor uncertainty $\Delta$). In an implementation, sensor fusion methods for detecting sensor faults and correcting measurement outliers can satisfy this assumption. Definition 4 captures what it means for states to be similar with respect to a measurement that is subject to uncertainty.

Definition 4 (Uncertainty Similarity).

Use $w \hat{\approx}_y^\Delta$ to denote the fact that w=v on $\{y\}^C$ with $w(y) \in U_\Delta(v(\hat{y}))$ and say that state w is $\Delta$-uncertainty-similar to state v.

Figure 8:
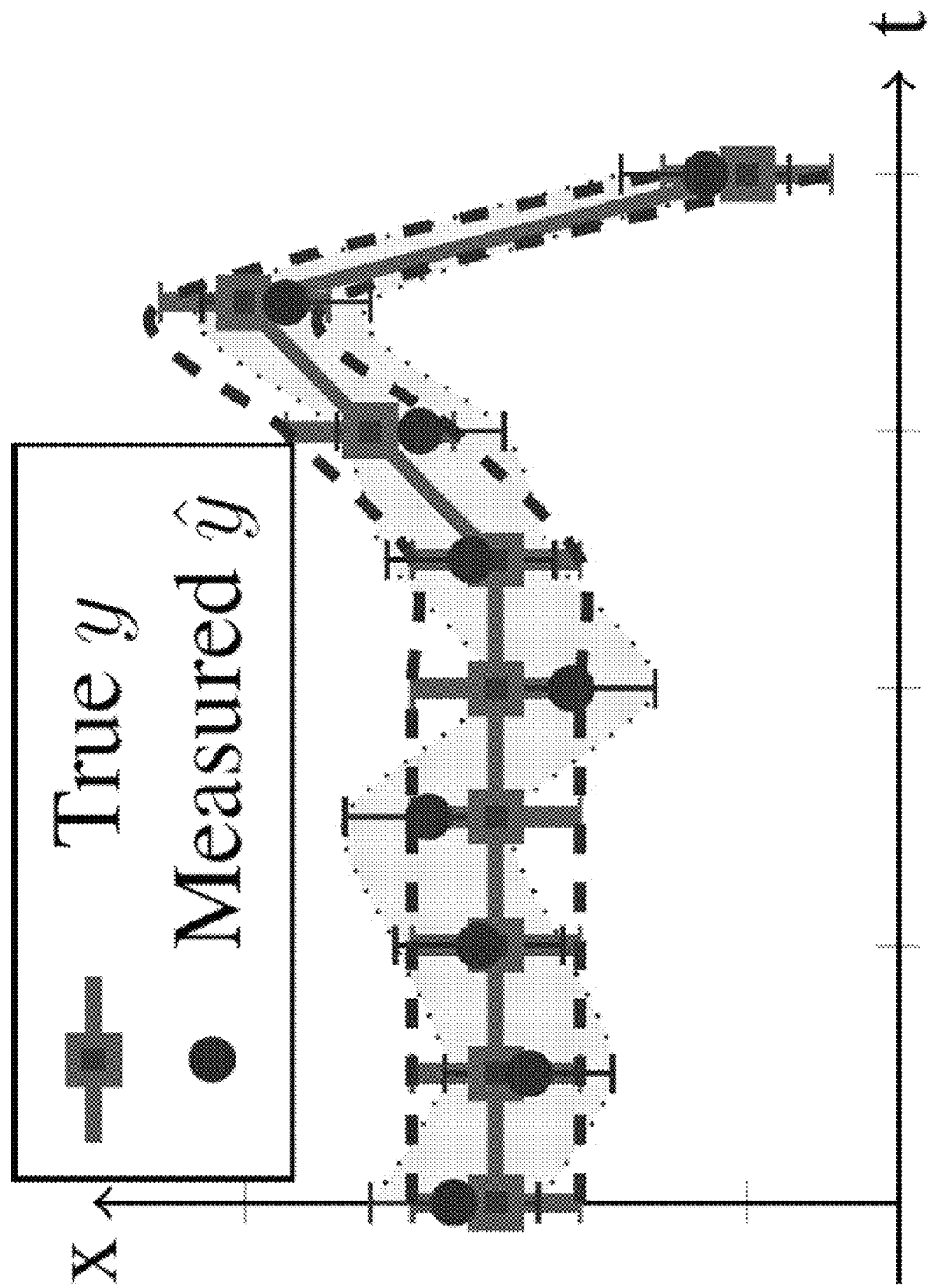
FIG. 8 is a graph showing measurements with sensor uncertainty, showing true values and measured values.

In the following paragraphs, $\Delta$-techniques are developed to synthesize monitors that indicate whether or not there exist states that are $\Delta$-uncertainty-similar to measured states and connected through a program $\alpha$, for measured states w and v do there exist uncertainty-similar states $\tilde{w}$ and $\tilde{v}$ such that $\tilde{w} \hat{\approx}_y^\Delta$, $\tilde{v} \hat{\approx}_y^\Delta v$ and Model Monitors for Pairwise Consistency of Measurements Monitoring based on measurements requires a decision as to whether the true values y fit to a model $\alpha$ by only looking at the measurements $\hat{y}$. Intuitively, this can be answered by finding an unobservable prior state $y \in U_\Delta(\hat{y})$ close to the measurement $\hat{y}$, such that running the model $\alpha$ on this possible y predicts a next unobservable $y^+$ that is within measurement uncertainty $y^+ \in U_\Delta(\hat{y}^+)$ to the next measurement $y^+$. This intuition is illustrated in FIG. 8: a pair of two consecutive measurements is plausible if the potential true values of the second measurement overlap with the values predicted by the model $\alpha$ from one of the potential prior y (which is estimated from the previous measurement).

The goal when formalizing this intuition into monitoring conditions is to shift proof effort offline. Therefore, offline proofs are combined with online monitoring: (i) offline proving that the modeled dynamics ensure that all potential true values around the measurements satisfy an invariant property for safety (contraction, see Definition 5); and (ii) online monitoring that some potential true values around the measurements can be connected with the modeled dynamics (See Eq. 7). Both requirements are expressible by quantifying over potential true values in $d\mathcal{L}$.

Definition 5 (Contraction). The contraction $\forall y \in U_\delta(\hat{y})J$ of margin $\delta \geq 0$ ensures $\forall y \in U_\delta(\hat{y})J$ (i.e. J for all potential values y in the $\delta$-neighborhood of the value $\hat{y}$. Program $\beta$ is contraction-safe for margin $\delta$ with measurement uncertainty $\Delta$ if $\forall y \in U_\delta(\hat{y})J \rightarrow [u:\in\beta; x'=f(x, u); ?t=\epsilon; \hat{y}:\in U_\Delta(y)]\forall y \in U_\delta(\hat{y})J$ is valid.

Monitor condition Eq.(7) answers the question of the plausibility of two measurements $\hat{y}$ and $\hat{y}^+$ taken $t = \epsilon$ time apart according to the model dynamics by asking for existence of true values y and $y^+$.

$$X_m \equiv \exists y \in U_\Delta(\hat{y}) \langle u:\in \text{ctrl}(\hat{y}); x'=f(x,u); ?t=\epsilon; \hat{y}:\in U_\Delta(y)\rangle \langle \exists y^+ \gamma^+ \rangle \quad (7)$$

To facilitate monitor synthesis, both measurements $\hat{y}$ and $\hat{y}^+$ are needed in a single loop iteration. Therefore, Eq.(7) takes fresh measurements after x'=f(x, u). Now monitor condition (7) indicates that there exist true values close to the measurements; for these true values to have the desired properties, the controller $u \in \text{ctrl}(\hat{y})$ must be contraction-safe, as shown by Theorem 6.

Theorem 6 (Pairwise Measurement Monitor Preserves Invariants).

Let $\alpha$ be a program of the shape $u:\in \text{ctrl}(\hat{y}); x'=f(x, u); ?t=\epsilon; \hat{y}:\in U_\Delta(y)$ with contraction-safe controller $u:\in \text{ctrl}(\hat{y})$ for margin $\Delta$ and measurement uncertainty $\Delta$ (i.e., $\forall y \in U_\delta(\hat{y})J \rightarrow [\alpha]\forall y \in U_\delta(\hat{y})J$) is valid. Assume the system transitions from w to v, which agree on $BV(\alpha)^C$, with non-faulty sensors, so $w \in [[y \in U_\Delta(\hat{y})]]$ and $v \in [[y \in U_\Delta(\hat{y})]]$. If the contraction holds $w \in [[\forall y \in U_\delta(\hat{y})J]]$ and the pairwise measurement monitor satisfies (w, v) $\models \exists y \in U_\Delta(\hat{y})(\alpha)(\exists y^+ y^+)$ then J is preserved (i.e., $v \in [[J]]$).

Theorem 6 extends to vectors of several unobservable variables y and their measured variables $\hat{y}$ in a straightforward way. The test ?t=$\epsilon$ is reflected in monitor condition (7), so the monitor is only satisfied for states w and v according to the sampling interval $\epsilon$ (formally: v(t)=w(t)+$\epsilon$ for clock t'=1).

Besides safety, monitoring for existence of unobservable values y that fit to the present measurements $\hat{y}$ also guarantees that the variation between true values is bounded, but not that it forms a linked chain of model executions because true values are freshly estimated from only the last measurement (see FIG. 7, View (B) and Proposition 1).

Proposition 1 (Bounded Variation Coincidence).

Let $\alpha$ be a hybrid program of the form $u:\in \text{ctrl}(\gamma); x'=f(x, u); ?t=\epsilon; \hat{y}:\in U_\Delta(y)$. Assume the system transitions through the sequence of states $v_0, v_1, \ldots, v_n$, which agree on $BV(\alpha)^C$, such that $(v_{i-1}, v_i) \models X_m$ with Eq. (7) for all $1 \leq i \leq n$. Then there are $w_{i-1} \approx v_{i-1}, \mu \hat{\approx}_y^\Delta v_i$ such that $(w_{i-1}, \mu_i) \in [[\alpha]]$.

Proposition 2 and Corollary 1 bound the maximum variation between true values y and measurements $\hat{y}$ that the monitor condition must allow according to the model.

Proposition 2 (Single-Step Variation Distance).

Let $\alpha$ be a hybrid program of the form $u:\in \text{ctrl}(\hat{y}); x'=f(x, u); ?t=\epsilon; \hat{y}:\in U_\Delta(y)$. Assume the model transitions (w, v) $\in [[\alpha]]$ with intermediate states $\mu$ and $\hat{\mu}$ such that $(w,\mu) \in [[u:\in \text{ctrl}(\hat{y})]]$, $(\mu,\hat{\mu}) \in [[x'=f(x, u)]]$, and $(\hat{\mu}, v) \in [[\hat{y} \in U_\Delta(y)]]$. If $(w, v) \models X_m$ then the variation distance in a single $\alpha$-step is bounded: $v(\gamma) \in U_{4\Delta}(w(y)+\hat{\mu}(y))$ and $v(y) \in U_{3\Delta}(w(\hat{y})+\hat{\mu}(y)-\mu(y))$.

Corollary 1 (Multi-Step Distance).

Assume the model transitions through a sequence of states $v_0, v_1, \ldots, v_n$ with intermediate states $\mu_i$ and $\hat{\mu}_i$ s.t. $(v_{i-1},\mu_i) \in [[u:\in \text{ctrl}(\hat{y})]]$, $(\mu_i,\hat{\mu}_i) \in [[x'=f(x, u); ?t=\epsilon]]$ and $(\hat{\mu}_i,$ $v_i) \in [[\hat{y} \in U_\Delta(y)]]$. If $(v_{i-1}, v_i) \models X_m$ for all $1 \leq i \leq n$ then the variation is bounded: $v_n(y) \in U_{2\Delta(n-1)}(v_0(y)) + \Sigma_{i=1}^{n}(\hat{\mu}_i(y) - \mu_i(y)))$.

As a consequence of Proposition 2 and Corollary 1, Theorem 6 is useful for single-step consistency checks: such a monitor (i) keeps at least $\Delta > 0$ safety margin with a contraction-safe controller because otherwise freshly estimating true y from measurements on every iteration does not preserve invariants, and (ii) detects "large" deviations that occur in a single monitoring step. However, pairwise consistency is unable to detect gradual drift and therefore has to be safeguarded for its entire $2\Delta(n+1)$ deviation over n steps, which inhibits motion, and cannot exploit improving the safety margin $\Delta$ over a history of measurements.

Model Monitors for Rolling Consistency of Measurements

Figure 9:
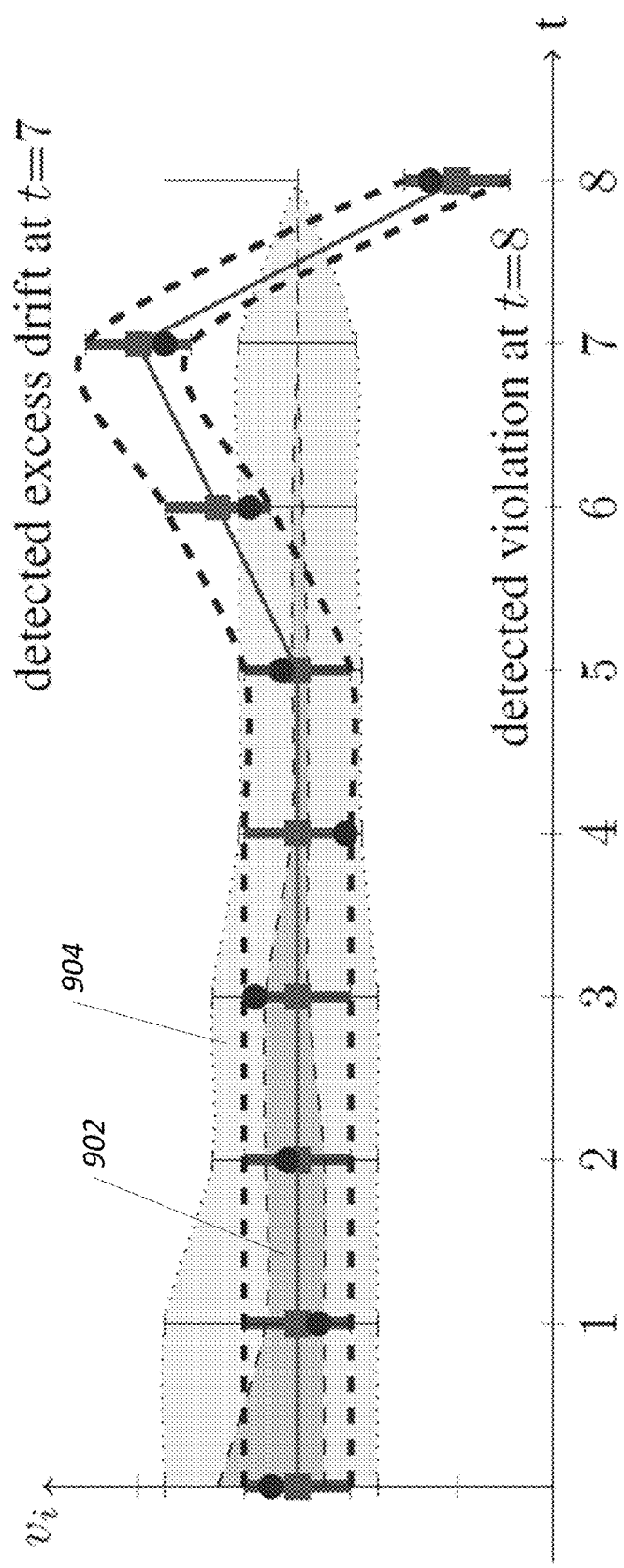
FIG. 9 is a graph showing the bounds for a variable being derived from a measurement history and the detection of excess drift over time.

Even if measurement pairs in isolation do not exceed the detectable single-step violation of the previous section, the resulting aggregated drift over multiple measurements is still detectable when we keep a history of the control choices. Instead of an explicit list of measurement and control choice histories, the actuation and measurement history can be aggregated into what really matters: acceptable bounds for the upcoming true values (area 902 in FIG. 9) and measurements (area 904 in FIG. 9). The bounds are updated on each monitor execution, taking into account the current control choice. The resulting rolling state estimator detects gradual deviations over the course of multiple measurements.

Definition 6 (Non-Diverging Rolling State Estimator).

A rolling state estimator $[l,u] := e(\hat{y}_0, \hat{y}, y-y_0, \Delta, [l_0, u_0])$ updates the estimate $[l,u]$ from the previous measurement $\hat{y}_0$, current measurement $\hat{y}$, the modeled interpolated plant effect $y-y_0$ and the previous estimate $[l_0, u_0]$ with $y_0 \in U_{[l_0, u_0]}(\hat{y}_0)$ and $U_{[l_0, u_0]}(\hat{y}_0) \subseteq U_\Delta(\hat{y})$. The rolling state estimator is non-diverging if $u-l \leq U_0 - l_0$ for all $\hat{y}_0, \hat{y}, y-y_0, l, u$ with $y \in U_{[l,u]}(\hat{y})$ and $U_{[l,u]}(\hat{y}) \subseteq U_\Delta(\hat{y})$.

The rolling state estimator updates estimates $y \in U_{[l,u]}(\hat{y})$ of true y on every measurement such that the history of measurements is preserved in aggregate form. On each step, the monitor checks for existence of a true state y in the estimate and uses the rolling state estimator to incorporate the current measurement $\hat{y}$ into the estimate for the next check. This also means that the plant effect $y-y_0$ is existentially quantified in the monitor condition of Eq.(8) below, so does not need to be directly observable.

The following basic rolling state estimator is non-diverging:

$$l = \max(-\Delta, \hat{y}_0 - \hat{y} + y - y_0 + l_0)$$

$$u = \max(-\Delta, \hat{y}_0 - \hat{y} + y - y_0 + u_0)$$

For a sequence of n measurements, a non-diverging rolling state estimator keeps tighter bounds compared to the $2\Delta(n+1)$ bounds of Corollary 1 without measurement history. Note that measurements typically vary due to sensor uncertainty, so the estimate almost surely even improves over time by observing measurements.

The monitor condition (8) checks the plausibility of a history of measurements $\hat{y}: \in U_\Delta(y)$ by estimating the true $y \in U_{[l,u]}(\hat{y})$ from the observations.

$$X_m \equiv \exists y \in U_{[l,u]}(\hat{y}) \underbrace{\langle y_0 := y; \hat{y}_0 := \hat{y}; u: \in ctrl(\hat{y}); x' = f(x,u); ? t = \varepsilon;}_{\text{remember prior state}} \quad (8)$$

$$\underbrace{\hat{y}: \in U_{\Delta(y)}}_{\text{measure}}; \underbrace{[l,u] := e(\hat{y}_0, \hat{y}, y-y_0, \Delta, +[l_0, u_0])}_{\text{update eestimator}})(\exists y^+ \gamma^+)$$

The dynamics $x' = f(x, u)$ over time are reflected by the rolling state estimator in the estimate $y \in U_{[l,u]}(\hat{y})$, which guarantees safety by Theorem 7.

Theorem 7 (Monitor with rolling state estimator maintains invariants).

Let $\alpha$ be a program of the form $y_0 := y; \hat{y}_0 := \hat{y}; u: \in ctrl(\hat{y}); x' = f(x, u); ?t = \varepsilon; \hat{y}: \in U_\Delta(\gamma); [l,u] := e(\hat{y}_0, \hat{y}, y-y_0, \Delta, [l_0, u_0])$ with a contraction-safe program $y_0 := y; \hat{y}_0 := \hat{y}; u: \in ctrl(\hat{y})$ for margin $[l,u]$ and measurement uncertainty $\Delta$. Assume the system transitions from w to v, which agree on $BV(\alpha)^C$, with non-faulty sensors, so both $w \in [[y \in U_\Delta(\hat{y})]]$ and $v \in [[y \in U_\Delta(\hat{y})]]$. If $w \in [[\forall y \in U_{[l,u]}(\hat{y})J]]$ and the monitor condition (8) is satisfied, i.e., $(w, v) \models \exists y \in U_{[l,u]}(\hat{y}) < \alpha > (\exists y^+ \gamma^+)$, then the invariant J is maintained: $v \in [[J]]$.

Theorem 7 extends to vectors of several unobservable variables y and their measured variables $\hat{y}$ in a straightforward way.

In summary, the approach disclosed herein improves over existing runtime monitoring techniques with provably correct monitor conditions, explicit dynamics with sensor uncertainty and actuator disturbance, and shifts expensive computation offline.

Specification—

Other methods start from purely discrete monitor specifications and therefore the continuous dynamics are implicit and unchecked (e.g., a monitor specification "always positive distance to obstacles" has the implicit unrealistic assumption that a car can stop instantaneously from any speed). In contrast, the approach disclosed herein starts from safety requirements about dynamical hybrid system models with continuous dynamics and therefore synthesizes monitor specifications that are provably correct with respect to the dynamics model (e.g., a specification "always positive distance to obstacles" in the approach herein results in a monitor "always sufficient stopping distance" that acts ahead of time as opposed to after a collision).

Assumptions Between Sampling Points—

Methods that rely on discrete time or combine discrete-time with continuous-time descriptions require additional assumptions on the continuous dynamics between sampling points to be sound, which is handled in the approach herein explicitly, to characterize partial controllability and partial observability and to distinguish between deviation caused by mere uncertainty versus actually unsafe environment behavior.

Offline Computation—

Some methods rely on extensive runtime computations (e.g., reachable sets). The approach herein, in contrast, performs expensive computations offline. At runtime, the resulting formula is only evaluated in real arithmetic for concrete sensor values and control decisions, which enables fast enough responses.

Crucially, the approach herein proves correctness properties that correctly link satisfied monitors to offline safety proofs, resulting in monitors that warn ahead offline, and account for partial controllability and partial observability so that the monitored system inherits the safety guarantees about the model.

Provable guarantees about the safety of cyber-physical systems at runtime are crucial as systems become increasingly autonomous. Formal verification techniques provide an important basis by proving safety of CPS models, which then requires transferring the guarantees of offline proofs to system execution. The approach herein addresses the key question of how offline proofs transfer by runtime monitoring, and crucially, what property needs to be runtime-monitored to imply safety of the monitored system. The disclosed techniques significantly extend previous methods to models of practical interest by implementing proof tactics for differential dynamic logic that correctly synthesize monitor conditions that are robust to bounded sensor uncertainty and bounded actuator disturbance, which are both fundamental sources of partial observability in models.

We claim:

1. A process for verifying compliance of a partially observable cyber-physical system (CPS) with a proven hybrid model of the CPS, the hybrid model describing a desired behavior of the CPS with both observable and unobservable variables, comprising the steps of:
   deriving a monitor specification from the hybrid model in differential dynamic logic, the monitor specification comprising a set of logical constraints regarding behavior of the model;
   obtaining consecutive sensor measurements from one or more sensors measuring one or more observable quantities during operation of the CPS;
   determining a monitor verdict, using the monitor specification, the monitor verdict indicating success if prior measurements of the one or more observable quantities are predictive of future measurements of the one or more observable quantities and one or more inferred unobservable quantities within an acceptable measurement uncertainty, and, indicating failure otherwise;
   wherein a successful monitor verdict guarantees safety of the CPS and compliance of the observable and unobservable true behavior of the CPS with the hybrid model; and
   engaging a fallback action of the CPS when the monitor verdict indicates failure.

2. The process of claim 1 wherein the CPS includes a controller running control software, the controller reading the one or more sensors and controlling one or more actuators, wherein the hybrid model specifies the actions of the controller, the sensors, the actuators and the resulting changes in state of the CPS to verify the desired behavior of the CPS.

3. The process of claim 1, wherein the hybrid model describes discrete control actions of one or more controllers in the CPS and continuous physics of the CPS and the environment of the CPS.

4. The process of claim 2 wherein discrepancies between the one or more sensor measurements and unobservable true values is due, at least in part, to disturbances in the one or more actuators.

5. The process of claim 4 wherein actuator disturbances may be determined by monitoring differences between an intended effect of an actuator action and an actual effect of the actuator action from observable quantities.

6. The process of claim 2 wherein discrepancies between the one or more sensor measurements and unobservable true values are reflected as sensor uncertainties.

7. The process of claim 1 further comprising:
   proving, offline, that the hybrid model ensures that all potential true values for the one or more variables satisfy an invariant property of the hybrid model; and
   monitoring, online, that some potential true values of the one or more variables can be connected with the hybrid model.

8. The process of claim 1 further comprising: identifying non-compliance of the CPS with the monitor specification when two consecutive measurements for any variable show significant deviation from the monitor specification.

9. The process of claim 1 further comprising:
   determining acceptable bounds for future true values of the one or more variables based on an aggregate of actuation and measurement history for the one or more variables; and
   updating the bounds each time second measurements are received; and
   determining gradual deviation of the true values of the one or more variables from the hybrid model over multiple measurements.

10. The process of claim 1 wherein no controller violation that can be overwritten when the monitor fails can cause unsafety of the hybrid model.

11. The process of claim 1 wherein a monitor violation will be triggered when any deviation between measurements and the hybrid model permits unsafe future model behavior.

12. The process of claim 2 further comprising executing the hybrid model in conjunction with the control software to guarantee compliance of the CPS with the hybrid model.

13. The process of claim 2 wherein the step of transforming the hybrid model and monitor specification into a set of monitor conditions further comprises applying a theorem prover to the hybrid model and monitor specification.

14. The process of claim 2 where the hybrid model consists of a model monitor, a controller monitor and a prediction monitor.

15. The process of claim 14 wherein the model monitor compares a current state of the CPS with a previous state of the CPS and determines if the difference between the current state and the previous state is in compliance with the hybrid model.

16. The process of claim 14 wherein the controller monitor monitors the controller to check compliance with the hybrid model.

17. The process of claim 14 wherein the prediction monitor allows deviations of the CPS system from the hybrid model to account for real-world imperfections.

18. The process of claim 17 wherein the model monitor, the controller monitor and the prediction monitor read the one or more sensors to determine a current state of the CPS.

19. The process of claim 14 wherein the model monitor runs prior to the control software and determines if observed physical behavior which occurred between the previous state of the CPS and the current state of the CPS is in compliance with the hybrid model.

20. The process of claim 19 wherein the model monitor will raise an error if the difference between the current state and the previous state is not in compliance with the hybrid model.

21. The process of claim 19 wherein the controller monitor runs after the controller software and determines if physical actions to be taken by the controller will result in the CPS being in compliance with the hybrid model.

22. The process of claim 21 wherein the controller monitor raises an error if the physical actions to be taken by the controller will result in the CPS not being in compliance with the hybrid model.

23. The process of claim 14 wherein the prediction monitor runs after the control software and determines if physical actions to be taken by the controller will result in the CPS being in compliance with the hybrid model in the presence of bounded deviations between the CPS and the hybrid model.

24. The process of claim 23 wherein the prediction monitor will raise an error if the physical actions to be taken by the controller will result in the CPS not being in compliance with the hybrid model.

25. The process of claim 24 wherein the hybrid model comprises a set of formulas of the form:

$$\phi \rightarrow [\alpha^*]\psi \text{ with invariat } \varphi \rightarrow [\alpha]\varphi \text{ s.t. } \phi \rightarrow \varphi \text{ and } \varphi \rightarrow \psi \qquad (1)$$

26. The process of claim 1 wherein the monitor specification comprises a set of specification conjectures for model monitors of the form:

$$\varnothing|_{const} \rightarrow \langle a \rangle \gamma_{V_m}^+.$$

27. The process of claim 1 wherein the monitor specification comprises a set of specification conjectures for controller monitors of the form:

$$\varnothing|_{const} \rightarrow \langle a_{ctrl} \rangle \gamma_{V_c}^+.$$

28. The process of claim 1 wherein the process is automated if the hybrid model is of the form $(\alpha_{ctrl}; \alpha_{plant})$ without nested loops, with solvable differential equations in $\alpha_{plant}$ and a disturbed plant $\alpha_{\delta plant}$ with constant additive disturbance $\delta$.

29. The process of claim 14 wherein compliance with the model monitor guarantees that the properties of the hybrid model are present in the CPS before the controller software is executed.

30. The process of claim 14, the compliance with the controller monitor guaranteeing that properties of the hybrid model are present in the CPS after the controller software is executed.

31. The process of claim 14, wherein compliance with the prediction monitor guarantees that properties of the hybrid model will still be present in future states of the CPS.

* * * * *

UNITED STATES PATENT AND TRADEMARK OFFICE
CERTIFICATE OF CORRECTION

PATENT NO. : 11,204,838 B2
APPLICATION NO. : 16/685099
DATED : December 21, 2021
INVENTOR(S) : Stefan Mitsch et al.

It is certified that error appears in the above-identified patent and that said Letters Patent is hereby corrected as shown below:

In the Claims

Column 23, Claim 26, Formula; Please Replace "$\emptyset|_{const} \rightarrow \langle a \rangle \Upsilon^+_{v_m}$" with --$\emptyset|_{const} \rightarrow \langle \alpha \rangle \Upsilon^+_{v_m}$--

Column 23, Claim 27, Formula; Please Replace "$\emptyset|_{const} \rightarrow \langle a_{ctrl} \rangle \Upsilon^+_{v_c}$" with --$\emptyset|_{const} \rightarrow \langle \alpha_{ctrl} \rangle \Upsilon^+_{v_c}$--

Signed and Sealed this
Seventeenth Day of May, 2022

Katherine Kelly Vidal
*Director of the United States Patent and Trademark Office*